(12) United States Patent
Sharma et al.

(10) Patent No.: US 8,957,752 B2
(45) Date of Patent: Feb. 17, 2015

(54) INVERTER HOUSING SYSTEM

(75) Inventors: Harindranath K. Sharma, Bangalore (IN); Ashok Kumar Kancharla, Vijayawada (IN); Narendra Anand Hardikar, Bangalore (IN); Sanjay Bedi, Gurgaon (IN)

(73) Assignee: Sabic Global Technologies B.V. (NL)

( * ) Notice: Subject to any disclaimer, the term of this patent is extended or adjusted under 35 U.S.C. 154(b) by 0 days.

(21) Appl. No.: 14/350,143

(22) PCT Filed: Oct. 7, 2011

(86) PCT No.: PCT/IB2011/054434
§ 371 (c)(1),
(2), (4) Date: Apr. 7, 2014

(87) PCT Pub. No.: WO2013/050807
PCT Pub. Date: Apr. 11, 2013

(65) Prior Publication Data
US 2014/0247554 A1    Sep. 4, 2014

(51) Int. Cl.
*H01F 27/02* (2006.01)

(52) U.S. Cl.
USPC .......................................... 336/90

(58) Field of Classification Search
USPC ........ 336/65, 90, 92, 220–223; 361/707–714, 361/670–695
See application file for complete search history.

(56) References Cited

U.S. PATENT DOCUMENTS

| | | | |
|---|---|---|---|
| 4,908,734 A | 3/1990 | Fujioka | |
| 5,012,173 A * | 4/1991 | Fujioka et al. | 318/727 |
| 7,042,745 B1 * | 5/2006 | Chen | 363/144 |
| 7,715,195 B2 * | 5/2010 | Bremicker et al. | 361/714 |
| 2002/0038795 A1 | 4/2002 | Katooka et al. | |
| 2002/0135983 A1 | 9/2002 | Freitas et al. | |
| 2004/0037056 A1 | 2/2004 | Kazem | |
| 2008/0153959 A1 | 6/2008 | Charati et al. | |
| 2011/0043082 A1 | 2/2011 | Billmann et al. | |

FOREIGN PATENT DOCUMENTS

| | | |
|---|---|---|
| DE | 20106518 U | 6/2001 |
| EP | 0928130 A1 | 7/1999 |

(Continued)

OTHER PUBLICATIONS

Japanese Patent No. 2000-078856 (A); Publication Date: Mar. 14, 2000; Machine Translation; 4 Pages.
German Patent No. 20106518 (U1); Publication Date: Jun. 7, 2001; Machine Translation; 25 Pages.
International Search Report; International Application No. PCT/IB2011/054434; International Filing Date: Oct. 7, 2011; Date of Mailing: May 24, 2013; 7 Pages.

(Continued)

*Primary Examiner* — Tuyen Nguyen
(74) *Attorney, Agent, or Firm* — Cantor Colburn LLP

(57) ABSTRACT

A housing system can comprise a plastic cover (12); a plastic base (14) comprising a floor (20) having side walls (22, 24); a first elevation (26); a second elevation (34); a first mounting column (40) located in a transformer end (32) of the plastic base (14) adjacent a major axis first sidewall (22); a second mounting column (42) located in the transformer end (32) of the plastic base (14) adjacent a major axis second sidewall (22); wherein the first and second mounting columns (40,42) have a top surface (44) that protrudes a distance from the floor (20), in the Z direction, in an amount greater than or equal to elevation walls (28,36), wherein the top surface (44) is configured to receive an attachment element (46). The housing system can also comprise a transformer (72), physically attached to the mounting columns; a capacitor (74); a fan (78), and a printed circuit board (80).

29 Claims, 12 Drawing Sheets

(56) References Cited

FOREIGN PATENT DOCUMENTS

GB    2336254 A    10/1999
JP    2000078856 A    3/2000

OTHER PUBLICATIONS

Written Opinion of the International Searching Authority; International Application No. PCT/IB2011/054434; International Filing Date: Oct. 7, 2011; Date of Mailing: May 24, 2013; 8 Pages.

U.S. Appl. No. 61/446,665; "Thermally Conductive and Elecrtically Insulative Polymer Compositions Containing a Thermally Insulative Filler and Uses Thereof"; filed Feb. 25, 2011.

U.S. Appl. No. 61/446,666; "Thermally Conductive and Elecrtically Insulative Polymer Compositions Containing a Low Thermally Conductive Filler and Uses Thereof"; filed Feb. 25, 2011.

* cited by examiner

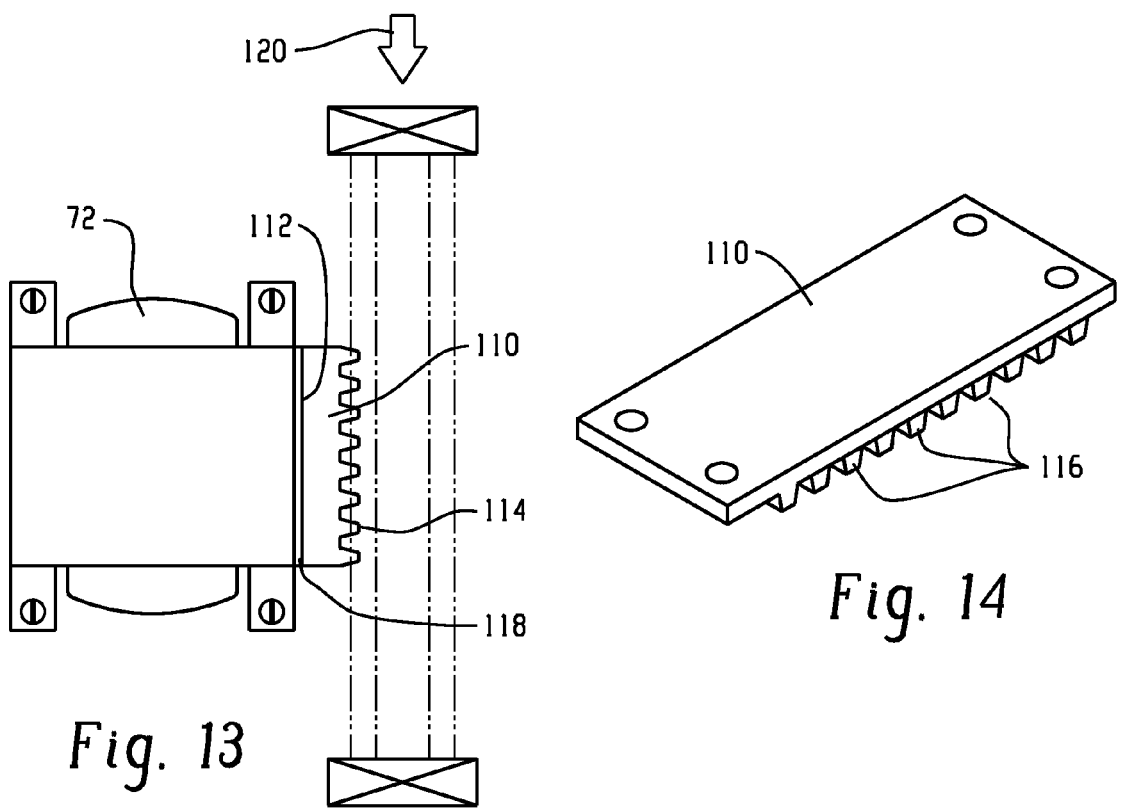
Fig. 13
Fig. 14
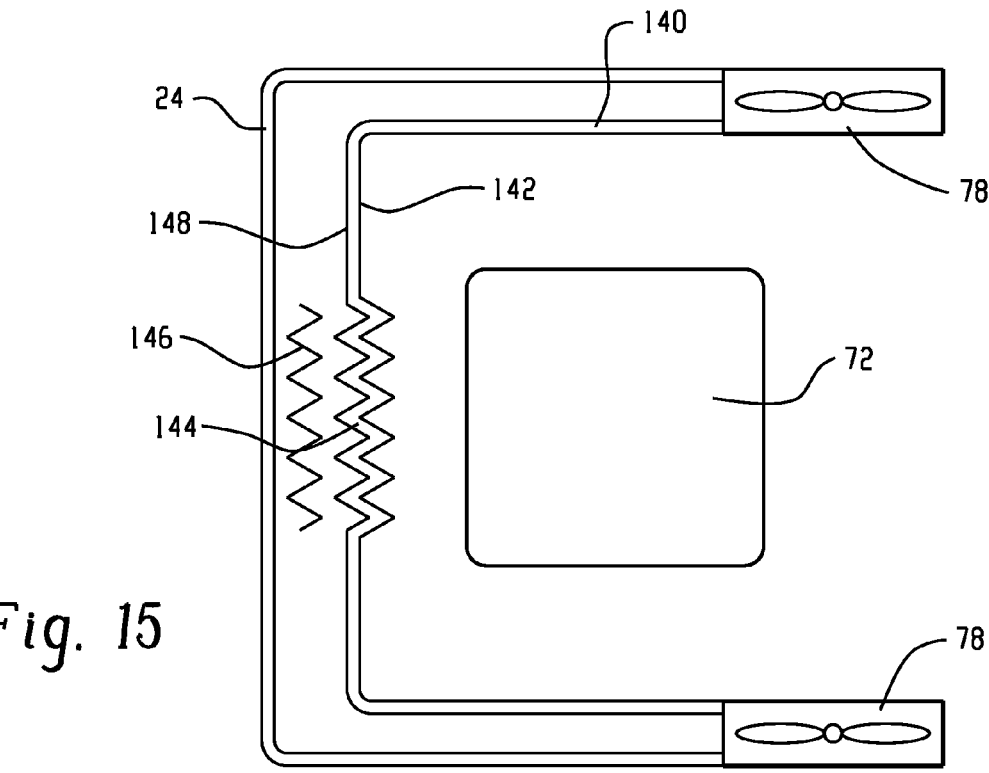
Fig. 15

INVERTER HOUSING SYSTEM

CROSS REFERENCE TO RELATED APPLICATION

This application is a 371 of International Application No. PCT/IB2011/054434, filed Oct. 7, 2011, the contents of which is hereby incorporated by reference in its entirety.

Disclosed herein are inverter housing systems with stress and thermal management components included therein.

BACKGROUND

Inverters are electrical devices that are generally connected to a power supply and convert a part of incoming electricity (e.g., convert direct current (DC) to alternating current (AC)) to supply power. Inverters can also convert a part of incoming electricity and store it in a storage device, which is utilized to supply power when a power outage occurs. Inverters are generally surrounded by a housing that protects the inverter components from damage, heat, or other outside elements that could impair the functionality of the inverter. Inverter housings made from sheet metal with slots or perforations for dissipation of internal heat by conduction or convection suffer from a lack of design freedom, which restrict the possibilities for aesthetic enhancement. The use of metal for inverter housings also increases the weight of the inverter system and requires the use of secondary operations such as painting, powder coating, and system. This increases the overall time to produce the inverter and the inverter housing, thus leading to increased production costs.

Thus, there is a need for inverter housings with increased design freedom and that are lighter in weight than all metal designs, and which can be produced and assembled more quickly, eliminating some or all secondary operations.

SUMMARY

Disclosed herein, in various embodiments, are housing systems.

In one embodiment, a housing system comprises: a plastic cover 12; a plastic base 14 having a major axis 16 and a minor axis 18, wherein the plastic base 14 comprises a floor 20 having sidewalls 22, 24 extending from the floor in a "Z" direction; a first elevation 26 formed from first elevation walls 28 protruding from the floor 20 in the Z direction and a first elevation bridge 41 extending between the first elevation walls 28, wherein the first elevation walls 28 extend along the major axis 16 from near a minor axis first sidewall 24 toward a transformer end of the base 32, wherein the first elevation 26 extends greater than or equal to 70% of a length of the floor 20 along the major axis 16 adjacent to a major axis first sidewall 22; and wherein the first elevation 26 extends along the minor axis 18 by greater than or equal to 5% of a width of the floor 20 along the minor axis 18; a second elevation 34 formed from second elevation walls 36 protruding from the floor 20 in the Z direction and a second elevation bridge 43 extending between the second elevation walls 36, wherein the second elevation walls 36 extend along the major axis 16 from near a minor axis second sidewall 24 toward a transformer end 32 of the plastic base 14, wherein the second elevation 34 extends greater than or equal to 70% of a length of the floor 20 along the major axis 16 adjacent to a major axis second sidewall 22; and wherein the second elevation 34 extends along the minor axis 18 by greater than or equal to 5% of a width of the floor 20 along the minor axis 18; a first mounting column 40 located in the transformer end 32 of the plastic base 14 adjacent the major axis first sidewall 22; a second mounting column 42 located in the transformer end 32 of the plastic base 14 adjacent the major axis second sidewall 22; wherein the first and second mounting columns 40, 42 have a top surface 44 that protrudes a distance from the floor 20, in the Z direction, in an amount greater than or equal to the elevation walls 28, 36, wherein the top surface 44 is configured to receive an attachment element 46.

BRIEF DESCRIPTION OF THE DRAWINGS

The following is a brief description of the drawings wherein like elements are numbered alike and which are presented for the purposes of illustrating the exemplary embodiments disclosed herein and not for the purposes of limiting the same.

FIG. 13 is a profile view of a vapor plate and transformer assembly.

FIG. 14 is a profile view of the vapor plate of FIG. 13.

FIG. 15 is a front view of a metal sheet for heat dissipation.

DETAILED DESCRIPTION

Figure 1:
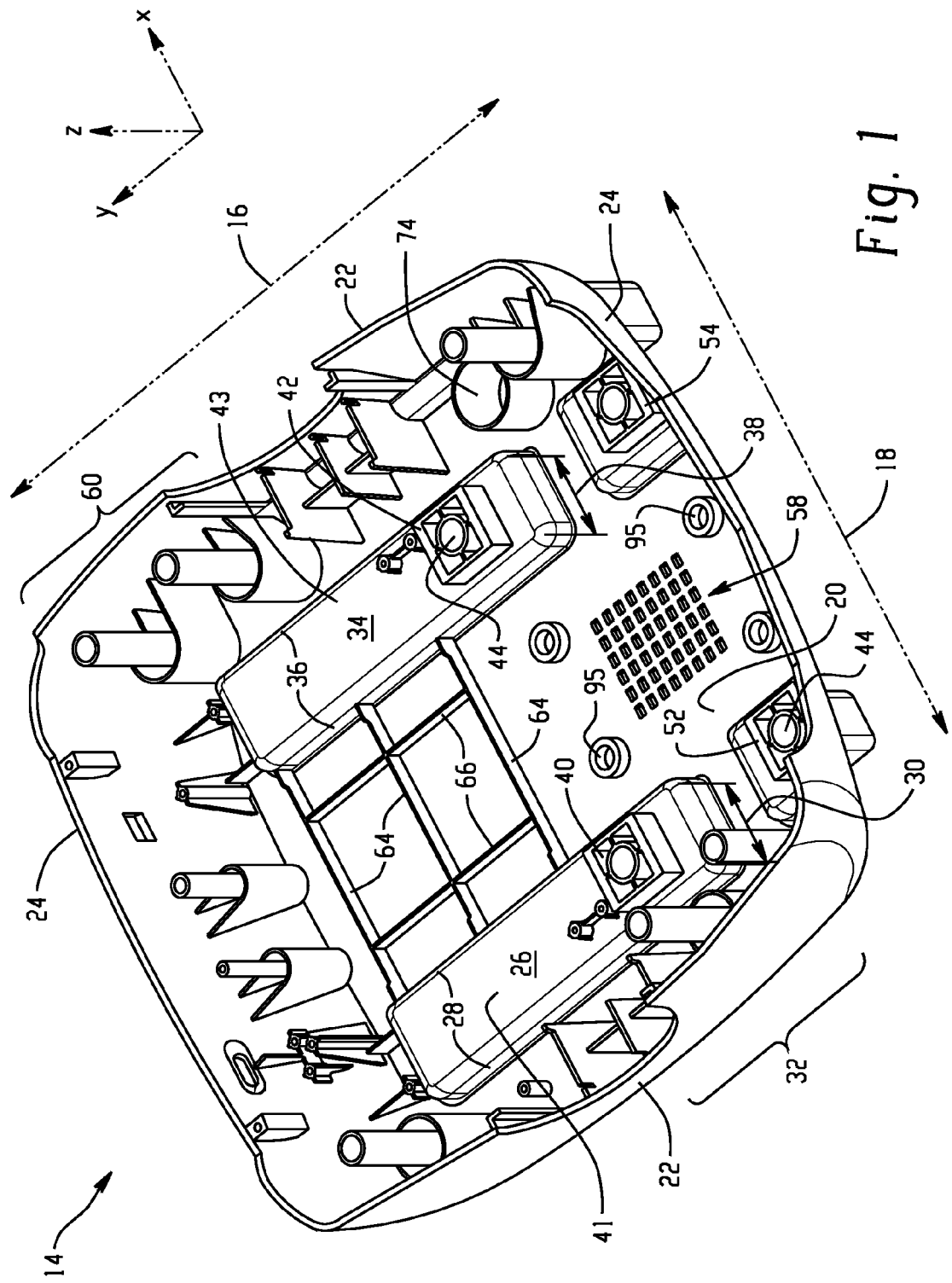
FIG. 1 is a perspective view of a plastic base of a housing system.

Inverter housing systems should be sufficiently strong to bear long term static load produced by the transformer and to absorb energy during an impact (e.g., from a fall) without cracking or damage to the internal inverter components. Inverter housing systems should also be able to withstand high operating temperatures that are generally associated with the internal components of the inverter without creep issues of the inverter housing systems. The use of thermoplastic materials for an inverter housing system can bring about the need for such design measures since thermoplastic materials are generally subject to creep when exposed to high temperatures for an extended period of time and generally possess lower impact strength properties as compared to, for example, metal. The thermoplastic inverter housing and housing systems disclosed herein can be designed to achieve performance characteristics such as the ability of the inverter housing system to sustain the impact upon a free fall from a specified height (e.g., 1.0 meter) with no cracking or damage to the internal inverter components, and/or thermal management to avoid the formation of creep on the inverter housing system, and ease of molding. Utilizing a thermoplastic material, such as an engineering thermoplastic material, enables the inverter housing system to possess the desired mechanical and thermal properties as well as allows for increased design freedom compared to inverter housing systems made entirely of metal.

Disclosed herein are housing systems (inverter housing and housing system are used interchangeably herein) comprising a plastic cover and a plastic base where an inverter in the housing can be connected to a power supply and can convert part of the incoming electricity (e.g., convert from direct current (DC) to alternating current (AC)) and, e.g., store it in a storage device. Specifically, disclosed herein are thermoplastic inverter housing systems that protect the internal components of the housing system from damage during impact suffered due to a fall or other applied force and thermal management concepts that quickly dissipate heat from the internal components of an inverter and protect the components from the formation of hot spots and creep issues.

The inverter comprises many components including, but not limited to, a transformer, a capacitor, electrical connectors, power semiconductors, printed circuit board (PCB), heat sinks, and/or battery, etc. The transformer can alter the voltage of the transformer (e.g., can raise or lower the voltage). The inverter housing system disclosed herein comprises a thermoplastic material, which facilitates integration of the inverter and inverter housing system by attachment elements (e.g., bosses and/or screws), allow the internal electronic parts to be mounted and integrated into the inverter housing system, eliminate secondary operations such as painting and powder coating, and provide greater design freedom to enable enhanced aesthetics and visual appeal of the inverter housing system. Desirably, the housing systems disclosed herein can be designed to withstand the forces associated with an accidental drop during assembly or installation processes without cracking and/or damage to the internal electronics of the housing system. During such a fall, the inertia of the transformer, which alone can weigh 7 kilograms (kg) for inverters with a volt ampere (VA) rating of 800, needs to be contained so as to not damage the internal components of the inverter. For example, the inverter housing system disclosed herein can be designed to withstand a fall distance of 1.0 meter (m) without visible cracking or visible damage to inverter housing system itself or to the internal electronic components of the inverter. For example, the inverter housing system, after being assembled with the internal electronics (e.g., transformer, PCB, capacitors, fan, etc.), can be closed by attaching a plastic cover to a plastic base.

The inverter housing system has enhanced structural integrity, e.g., as is evidenced by a structural impact test (SIT). The SIT includes surrounding the assembled inverter housing system with expandable polystyrene (EPS) packing material, enclosing the housing system and packing material in a six sided, cardboard container having a wall thickness of 3 millimeters (mm), specifically, 2 mm. The container is then dropped from a height of 1.0 meter (m) on each side of the container onto a carpeted surface with concrete underneath. After the container has been dropped so that all sides contact the surface, the container is opened and the inverter housing system and internal components of the inverter housing system are visually observed for any damage. With the inverter housing systems disclosed herein, no visible damage occurs to the inverter housing or the internal components located therein. In embodiments where the packing material is not present, the inverter housing system can withstand a fall from a distance of less than or equal to 0.75 m with no visible damage to the inverter housing or the internal components located therein.

The internal working mechanisms of the inverter generate heat. For example, peak temperatures on the transformer and on the heat sink on the electronic PCB can reach temperatures of about 115° C. The heat is mostly passed by convective currents to the surrounding walls of the inverter housing system. Generally, thermoplastic materials conduct less heat as compared to metals. This leads to the possibility of localized hot spots in the inverter housing system. Extended exposure of thermoplastic materials to high temperatures (e.g., about 115° C., although it is to be understood that the temperature is application and material specific) can lead to the occurrence of creep in the inverter housing system. Creep generally refers to the tendency of a material to slowly move or deform permanently under the influence of stress. The occurrence of creep in the housing system can ultimately lead to a premature failure of the housing system and subsequent failure of the inverter components. The housing system disclosed herein can be designed to quickly dissipate heat built up in the internal components of the inverter so as to avoid the formation of hot spots in the housing system that can lead to creep issues.

As described, the housing systems disclosed herein can be formed from thermoplastic materials. Possible thermoplastic resins that may be employed to form the housing system include, but are not limited to, oligomers, polymers, ionomers, dendrimers, and copolymers (such as graft copolymers, block copolymers (e.g., star block copolymers, random copolymers, etc.)) and combinations comprising at least one of the foregoing. Examples of such thermoplastic resins include, but are not limited to, polycarbonates (e.g., blends of polycarbonate (such as, polycarbonate-polybutadiene blends, copolyester polycarbonates)), polystyrenes (e.g., copolymers of polycarbonate and styrene, polyphenylene ether-polystyrene blends), polyimides (e.g., polyetherimides), acrylonitrile-styrene-butadiene (ABS), polyalkylmethacrylates (e.g., polymethylmethacrylates), polyesters (e.g., copolyesters, polythioesters), polyolefins (e.g., polypropylenes and polyethylenes, high density polyethylenes, low density polyethylenes, linear low density polyethylenes), polyamides (e.g., polyamideimides), polyarylates, polysulfones (e.g., polyarylsulfones, polysulfonamides), polyphenylene sulfides, polytetrafluoroethylenes, polyethers (e.g., polyether ketones, polyether etherketones, polyethersulfones), polyacrylics, polyacetals, polybenzoxazoles (e.g., polybenzothiazinophenothiazines, polybenzothiazoles), polyoxadiazoles, polypyrazinoquinoxalines, polypyromellitimides, polyquinoxalines, polybenzimidazoles, polyoxindoles, polyoxoisoindolines (e.g., polydioxoisoindolines), polytriazines, polypyridazines, polypiperazines, polypyridines, polypiperidines, polytriazoles, polypyrazoles, polypyrrolidines, polycarboranes, polyoxabicyclononanes, polydibenzofurans, polyphthalides, polyacetals, polyanhydrides, polyvinyls (e.g., polyvinyl ethers, polyvinyl thioethers, polyvinyl alcohols, polyvinyl ketones, polyvinyl halides, polyvinyl nitriles, polyvinyl esters, polyvinylchlorides), polysulfonates, polysulfides, polyureas, polyphosphazenes, polysilazzanes, polysiloxanes, and combinations comprising at least one of the foregoing.

More particularly, the plastic used in the housing system can include, but is not limited to, polycarbonate resins (e.g., Lexan* resins, commercially available from SABIC Innovative Plastics), polyphenylene ether-polystyrene resins (e.g., Noryl* resins, commercially available from SABIC Innovative Plastics), polyetherimide resins (e.g., Ultem* resins, commercially available from SABIC Innovative Plastics), polybutylene terephthalate-polycarbonate resins (e.g., Xenoy* resins, commercially available from SABIC Innovative Plastics), copolyestercarbonate resins (e.g. Lexan* SLX resins, commercially available from SABIC Innovative Plastics), and combinations comprising at least one of the foregoing resins. Even more particularly, the thermoplastic resins can include, but are not limited to, homopolymers and copolymers of a polycarbonate, a polyester, a polyacrylate, a polyamide, a polyetherimide, a polyphenylene ether, or a combination comprising at least one of the foregoing resins. The polycarbonate can comprise copolymers of polycarbonate (e.g., polycarbonate-polysiloxane, such as polycarbonate-polysiloxane block copolymer), linear polycarbonate, branched polycarbonate, end-capped polycarbonate (e.g., nitrile end-capped polycarbonate), and combinations comprising at least one of the foregoing, for example, a combination of branched and linear polycarbonate.

The thermoplastic material can be or can comprise a thermally conductive plastic material. The thermally conductive plastics can also be electrically insulating, e.g., having an electrical resistivity greater than or equal to $10^{13}$ Ohms per square (Ohm/sq). The thermally conductive plastic can comprise an organic polymer and a filler composition comprising graphite and boron nitride. For example, the thermally conductive plastic can have a bulk surface resistivity greater than or equal to $10^{13}$ Ohm/sq, while displaying a thermal conductivity greater than or equal to 2 Watts per meter Kelvin (W/mK). The melt flow index can be 1 to 30 grams per 10 minutes at a temperature of 280° C. and a load of 16 kilograms force per square centimeter (kg-f/cm$^2$). Exemplary thermally conductive plastics are disclosed in commonly assigned U.S. patent Ser. Nos. 61/446,665, 61/446,666, and 11/689,228.

The organic polymer used in the thermally conductive plastic can be selected from a wide variety of thermoplastic resins, blend of thermoplastic resins, thermosetting resins, or blends of thermoplastic resins with thermosetting resins, as well as combinations comprising at least one of the foregoing. The organic polymer may also be a blend of polymers, copolymers, terpolymers, or combinations comprising at least one of the foregoing organic polymers. The organic polymer can also be an oligomer, a homopolymer, a copolymer, a block copolymer (e.g., an alternating block copolymer, a random block copolymer, a star block copolymer), a random polymer, a random copolymer, a graft copolymer, a dendrimer, or the like, or a combination comprising at last one of the foregoing organic polymers. Examples of the organic polymer include polyacetals, polyolefins, polyacrylics, poly (arylene ether)polycarbonates, polystyrenes, polyesters (e.g., cycloaliphatic polyester, high molecular weight polymeric glycol terephthalates or isophthalates, and so forth), polyamides (e.g., semi-aromatic polyamid such as PA4.T, PA6.T, PA9.T, and so forth), polyamideimides, polyarylates, polyarylsulfones, polyethersulfones, polyphenylene sulfides, polyvinyl chlorides, polysulfones, polyimides, polyetherimides, polytetrafluoroethylenes, polyetherketones, polyether etherketones, polyether ketone ketones, polybenzoxazoles, polyphthalides, polyacetals, polyanhydrides, polyvinyl ethers, polyvinyl thioethers, polyvinyl alcohols, polyvinyl ketones, polyvinyl halides, polyvinyl nitriles, polyvinyl esters, polysulfonates, polysulfides, polythioesters, polysulfones, polysulfonamides, polyureas, polyphosphazenes, polysilazanes, styrene acrylonitrile, acrylonitrile-butadiene-styrene (ABS), polyethylene terephthalate, polybutylene terephthalate, polyurethane, ethylene propylene diene rubber (EPR), polytetrafluoroethylene, fluorinated ethylene propylene, perfluoroalkoxyethylene, polychlorotrifluoroethylene, polyvinylidene fluoride, or the like, or a combination comprising at least one of the foregoing organic polymers. Examples of polyolefins include polyethylene (PE), including high-density polyethylene (HDPE), linear low-density polyethylene (LLDPE), low-density polyethylene (LDPE), mid-density polyethylene (MDPE), glycidyl methacrylate modified polyethylene, maleic anhydride functionalized polyethylene, maleic anhydride functionalized elastomeric ethylene copolymers (like EXXELOR™ VA1801 and VA1803 from ExxonMobil), ethylene-butene copolymers, ethylene-octene copolymers, ethylene-acrylate copolymers, such as ethylene-methyl acrylate, ethylene-ethyl acrylate, and ethylene butyl acrylate copolymers, glycidyl methacrylate functionalized ethylene-acrylate terpolymers, anhydride functionalized ethylene-acrylate polymers, anhydride functionalized ethylene-octene and anhydride functionalized ethylene-butene copolymers, polypropylene (PP), maleic anhydride functionalized polypropylene, glycidyl methacrylate modified polypropylene, and a combination comprising at least one of the foregoing organic polymers.

In the context of this application a 'semi-aromatic polyamide' is understood to be a polyamide homo- or copolymer that contains aromatic or semi-aromatic units derived from an aromatic dicarboxylic acid, an aromatic diamine or an aromatic aminocarboxylic acid, the content of said units being at least 50 mol %. In some cases these semi-aromatic polyamides are blended with small amounts of aliphatic polyamides for better processability. They are available commercially e.g. DuPont, Wilmington, Del., USA under the Tradename Zytel HTN, Solvay Advanced Polymers under the Tradename Amodel or from DSM, Sittard, The Netherlands under the Tradename Stanyl For Tii.

Examples of blends of thermoplastic resins include acrylonitrile-butadiene-styrene/nylon, polycarbonate/acrylonitrile-butadiene-styrene, acrylonitrile butadiene styrene/polyvinyl chloride, polyphenylene ether/polystyrene, polyphenylene ether/nylon, polysulfone/acrylonitrile-butadiene-styrene, polycarbonate/thermoplastic urethane, polycarbonate/polyethylene terephthalate, polycarbonate/polybutylene terephthalate, thermoplastic elastomer alloys, nylon/ elastomers, polyester/elastomers, polyethylene terephthalate/polybutylene terephthalate, acetal/elastomer, styrene-maleicanhydride/acrylonitrile-butadiene-styrene, polyether etherketone/polyethersulfone, polyether etherketone/polyetherimide polyethylene/nylon, polyethylene/polyacetal, or the like.

Examples of thermosetting resins include polyurethane, natural rubber, synthetic rubber, epoxy, phenolic, polyesters, polyamides, silicones, or the like, or a combination comprising at least one of the foregoing thermosetting resins. Blends of thermoset resins as well as blends of thermoplastic resins with thermoset resins can be utilized.

In one embodiment, an organic polymer that can be used in the conductive composition is a poly(arylene ether). The term poly(arylene ether) polymer includes polyphenylene ether (PPE) and poly(arylene ether) copolymers; graft copolymers; poly(arylene ether) ionomers; and block copolymers of alkenyl aromatic compounds with poly(arylene ether)s, vinyl aromatic compounds, and poly(arylene ether), and the like; and combinations including at least one of the foregoing.

The organic polymer can be used in amounts of 10 to 85 weight percent (wt. %), specifically, 33 to 80 wt. %, more specifically 35 wt. % to 75 wt. %, and yet more specifically 40 wt. % to 70 wt. %, of the total weight of the moldable composition.

The filler composition used in the moldable composition comprises graphite and boron nitride. It is desirable to use graphite having average particle sizes of 1 to 5,000 micrometers. Within this range graphite particles having sizes of greater than or equal to 3 micrometers, specifically greater than or equal to 5 micrometers may be advantageously used. Also desirable are graphite particles having sizes of less than or equal to 4,000 micrometers, specifically less than or equal to 3,000 micrometers, and more specifically less than or equal to 2,000 micrometers. Graphite is generally flake like with an aspect ratio greater than or equal to 2, specifically greater than or equal to 5, more specifically greater than or equal to 10, and even more specifically greater than or equal to 50. In one aspect, the graphite is flake graphite, wherein the flake graphite is typically found as discrete flakes having a size of 10 micrometers to 800 micrometers in diameter (as measured along a major axis) and 1 micrometer to 150 micrometers thick, e.g., with purities ranging from 80-99.9% carbon. In another aspect the graphite is spherical.

Graphite is generally used in amounts of greater than or equal to 10 wt. % to 30 wt. %, specifically, 13 wt. % to 28 wt. %, more specifically 14 wt. % to 26 wt. %, and yet more specifically 15 wt. % to 25 wt. %, of the total weight of the moldable composition.

Boron nitride may be cubic boron nitride, hexagonal boron nitride, amorphous boron nitride, rhombohedral boron nitride, or another allotrope. It may be used as powder, agglomerates, fibers, or the like, or a combination comprising at least one of the foregoing.

Boron nitride has an average particle size of 1 to 5,000 micrometers. Within this range boron nitride particles having sizes of greater than or equal to 3 micrometers, specifically greater than or equal to 5 micrometers may be advantageously used. Also desirable are boron nitride particles having sizes of less than or equal to 4,000 micrometers, specifically less than or equal to 3,000 micrometers, and more specifically less than or equal to 2,000 micrometers. Boron nitride is generally flake like with an aspect ratio greater than or equal to 2, specifically greater than or equal to 5, more specifically greater than or equal to 10, and even more specifically greater than or equal to 50. An exemplary particle size is 125 to 300 micrometers with a crystal size of 10 to 15 micrometers. The boron nitride particles can exist in the form of agglomerates or as individual particles or as combinations of individual particles and agglomerates. Exemplary boron nitrides are PT350, PT360, or PT 370, commercially available from Momentive Performance Materials.

Boron nitride (BN) is generally used in amounts of 5 wt. % to 60 wt. %, specifically, 8 wt. % to 55 wt. %, more specifically 10 wt. % to 50 wt. %, and yet more specifically 12 wt. % to 45 wt. %, of the total weight of the moldable composition. An exemplary amount of boron nitride is 15 to 40 wt. % of the total weight of the thermally conductive plastic. In one aspect, the BN has a BN purity of 95% to 99.8%. In one aspect, a large single crystal sized flake BN with an average size of 3 to 50 micrometer and a BN purity of over 98% is used. The particle size indicated here means the single BN particle or its agglomerate at any of their dimensions.

One or more low thermally conductive fillers can be used. The low thermally conductive, electrically insulative filler has an intrinsic thermal conductivity of from 10 to 30 W/mK, specifically, 15 to 30 W/mK, and more specifically, 15 to 20 W/mK. The resistivity can be greater than or equal to $10^5$ (Ohm·centimeter). Examples of the low thermally conductive filler include, but are not limited to, ZnS (zinc sulfide), CaO (calcium oxide), MgO (magnesium oxide), ZnO (zinc oxide), $TiO_2$ (titanium dioxide), or a combination comprising at least one of the foregoing.

One or more high thermally conductive, electrically insulative fillers can be used. The high thermally conductive filler has an intrinsic thermal conductivity greater than or equal to 50 W/mK, specifically, greater than or equal to 100 W/mK, more specifically, greater than or equal to 150 W/mK. The resistivity can be greater than or equal to $10^5$ Ohm·cm. Examples of the high thermally conductive, electrically insulative filler include, but are not limited to, AlN (aluminum nitride), BN (boron nitride), $MgSiN_2$ (magnesium silicon nitride), SiC (silicon carbide), ceramic-coated graphite, or a combination comprising at least one of the foregoing.

One or more high thermally conductive, electrically conductive fillers can be used. The high thermally conductive, electrically conductive filler has an intrinsic thermal conductivity greater than or equal to 50 W/mK, specifically, greater than or equal to 100 W/mK, more specifically, greater than or equal to 150 W/mK. The resistivity can be less than or equal to 1 Ohm·cm. Examples of the high thermally conductive, electrically conductive filler include, but are not limited to, graphite, expanded graphite, graphene, carbon fiber, carbon nanotubes (CNT), graphitized carbon black, or a combination comprising at least one of the foregoing.

Additionally, the thermally conductive plastic can optionally also contain additives such as antioxidants, such as, for example, organophosphites, for example, tris(nonyl-phenyl) phosphite, tris(2,4-di-t-butylphenyl)phosphite, bis(2,4-di-t-butylphenyl)pentaerythritol diphosphite or distearyl pentaerythritol diphosphite, alkylated monophenols, polyphenols and alkylated reaction products of polyphenols with dienes, such as, for example, tetrakis[methylene(3,5-di-tert-butyl-4-hydroxyhydrocinnamate)]methane, 3,5-di-tert-butyl-4-hydroxyhydrocinnamate, octadecyl 2,4-di-tert-butylphenyl phosphite, butylated reaction products of para-cresol and dicyclopentadiene, alkylated hydroquinones, hydroxylated thiodiphenyl ethers, alkylidene-bisphenols, benzyl compounds, esters of beta-(3,5-di-tert-butyl-4-hydroxyphenyl)-propionic acid with monohydric or polyhydric alcohols, esters of beta-(5-tert-butyl-4-hydroxy-3-methylphenyl)-propionic acid with monohydric or polyhydric alcohols; esters of thioalkyl or thioaryl compounds, such as, for example, distearylthiopropionate, dilaurylthiopropionate, ditridecylthiodipropionate, amides of beta-(3,5-di-tert-butyl-4-hydroxyphenyl)-propionic acid; fillers and reinforcing agents, such as, for example, silicates, titanium dioxide ($TiO_2$), calcium carbonate, talc, mica and other additives such as, for example, mold release agents, ultraviolet absorbers, stabilizers such as light stabilizers and others, lubricants, plasticizers, pigments, dyes, colorants, anti-static agents, blowing agents, flame retardants, impact modifiers, among others, as well as combinations comprising at least one of the foregoing additives.

In one embodiment, the thermally conductive plastic comprises a random distribution of graphite and boron nitride and has a thermal conductivity of greater than 2 W/mK. In another embodiment, the thermally conductive plastic generally has a thermal conductivity of 2 to 6 W/mK, specifically, 2.2 W/mK to 4.0 W/mK, more specifically 2.3 W/mK to 3.9 W/mK, and yet more specifically 2.4 W/mK to 3.8 W/mK. In one embodiment, the thermally conductive plastic comprises: 35 volume percent (vol %) to 80 vol % of a thermoplastic polymer; 5 vol % to 45 vol % of a thermally insulative filler with an intrinsic thermal conductivity less than or equal to 10 W/mK; and 5 vol % to 15 vol % of a thermally conductive filler with an intrinsic thermal conductivity greater than or equal to 50 W/mK. The thermally conductive plastic can have a thermal conductivity of greater than or equal to 1.0 W/mK, a thermal conductivity of greater than or equal to 7 times the total filler volume fraction times the thermal conductivity of the pure thermoplastic polymer; and/or a volume resistivity of greater than or equal to $10^7$ Ohm-centimeter (Ohm·cm). Optionally, the thermally conductive filler can comprise AlN, BN, $MgSiN_2$, SiC, graphite, ceramic-coated graphite, expanded graphite, graphene, a carbon fiber, a carbon nanotube, graphitized carbon black, or a combination comprising at least one of the foregoing thermally conductive fillers. In one embodiment, the thermoplastic polymer comprises a polyamide, polyester, polyethylene and ethylene based copolymer, polypropylene, polyphenylene sulfide, or a combination comprising at least one of the foregoing; the thermally insulative filler comprises talc, $CaCO_3$, $Mg(OH)_2$, or a combination comprising at least one of the foregoing; and the thermally conductive filler comprises graphite.

In another embodiment, the composition comprises: 35 vol % to 80 vol % of a thermoplastic polymer; 5 vol % to 45 vol % of a low thermally conductive, electrically insulative filler with an intrinsic thermal conductivity of 10 W/mK to 30 W/mK; 2 vol % to 15 vol % of a high thermally conductive, electrically insulative filler with an intrinsic thermal conductivity greater than or equal to 50 W/mK; and 2 vol % to 15 vol % of a high thermally conductive, electrically conductive filler with an intrinsic thermal conductivity greater than or equal to 50 W/mK. The composition can have a thermal conductivity of at least 1.0 W/mK and/or a volume resistivity of at least $10^7$ Ohm·cm.

Intrinsic thermal conductivity of a component, as used herein, is based on indicative values described in the literature, such as in "Thermal conductivity of Nonmetallic Solids," Y. S. Touloukian, R. W. Powell, C. Y. Ho, and P. G. Klemans, IFI/Plenum: New York-Washington, 1970 or "Thermal Conductivity—Theory, Properties and Applications," T. M. Tritt, Ed., Kluwer Academic/Plenum Publishers: New York, 2004. Thermal conductivity of a composition, as used herein, is tested according to ASTM E1461 in the through-plane (sample thickness) direction. It is the thermal conductivity of the material independent of how much of the material is present and independent of the form (shape, size, etc.) of the material.

Volume resistivity, as used herein, is measured by notching a sample bar on both ends followed by a cold-fracture at –60° C. The fractured surfaces are treated with silver paint and dried. The resistance through the bar is measured with a multi-meter to yield the volume resistivity (in Ω·m) and calculated from: volume resistivity=(R*A/L), where R is the electrical resistance (in Ω), A is the sample surface area, and L is the sample length (the electrical distance).

The thermoplastic material of the housing system can include various additives ordinarily incorporated into polymer compositions of this type, with the proviso that the additive(s) are selected so as to not significantly adversely affect the desired properties of the housing system, in particular, structural integrity. Such additives can be mixed at a suitable time during the mixing of the components for forming the inverter housing system. Exemplary additives include impact modifiers, fillers, reinforcing agents, antioxidants, heat stabilizers, light stabilizers, ultraviolet (UV) light stabilizers, plasticizers, lubricants, mold release agents, antistatic agents, colorants (such as carbon black and organic dyes), surface effect additives, radiation stabilizers (e.g., infrared absorbing), flame retardants, and anti-drip agents. A combination of additives can be used, for example a combination of a heat stabilizer, mold release agent, and ultraviolet light stabilizer. In general, the additives are used in the amounts generally known to be effective. The total amount of additives (other than any impact modifier, filler, or reinforcing agents) is generally 0.001 wt. % to 5 wt. %, based on the total weight of the composition of the housing system.

A more complete understanding of the components, processes, and apparatuses disclosed herein can be obtained by reference to the accompanying drawings. These figures (also referred to herein as "FIG.") are merely schematic representations based on convenience and the ease of demonstrating the present disclosure, and are, therefore, not intended to indicate relative size and dimensions of the devices or components thereof and/or to define or limit the scope of the exemplary embodiments. Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

Figure 2:
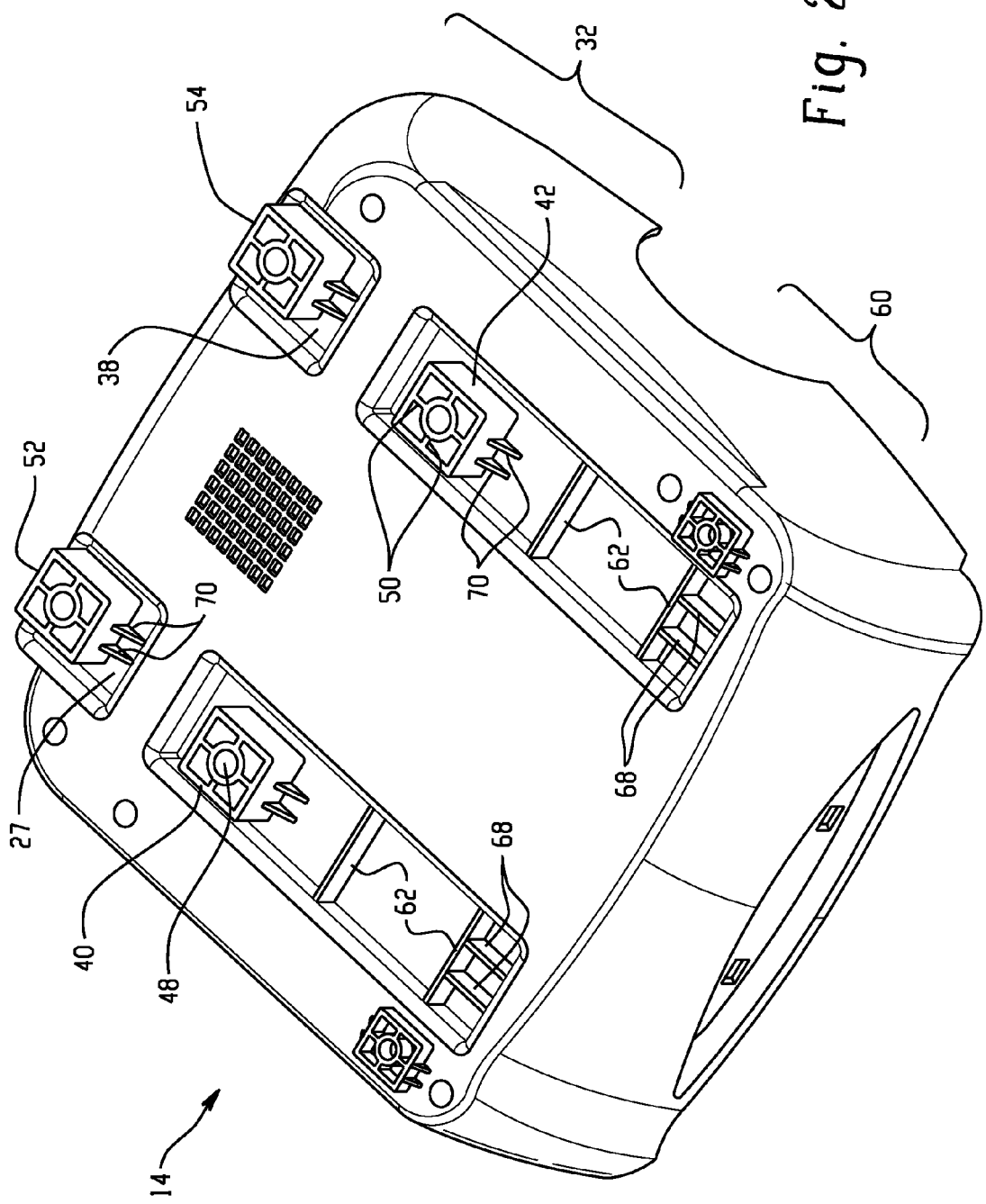
FIG. 2 is a perspective view of an opposite side of the plastic base of FIG. 1.
Figure 3:
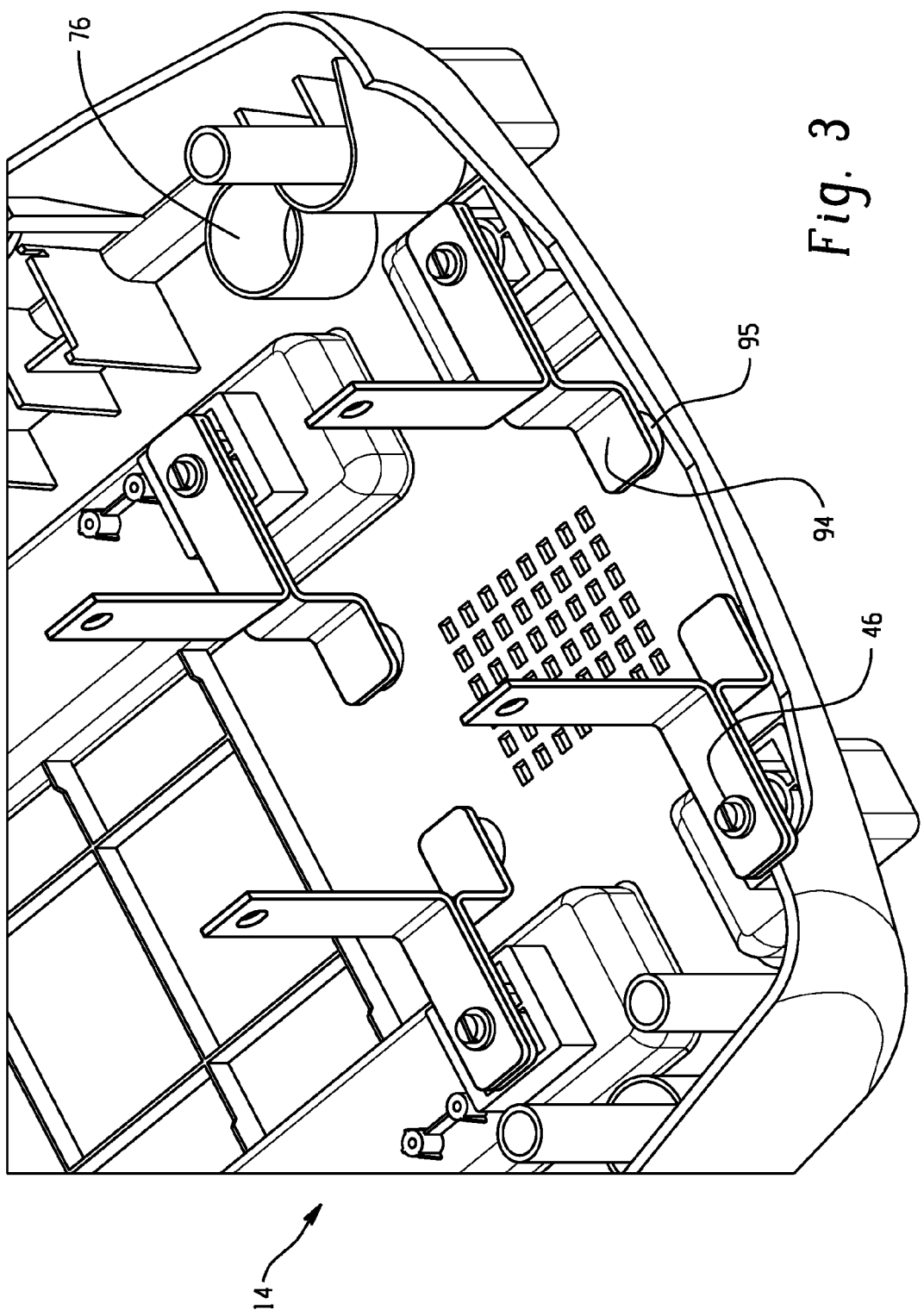
FIG. 3 is a partial, perspective view of the plastic base of FIG. 1
Figure 20:
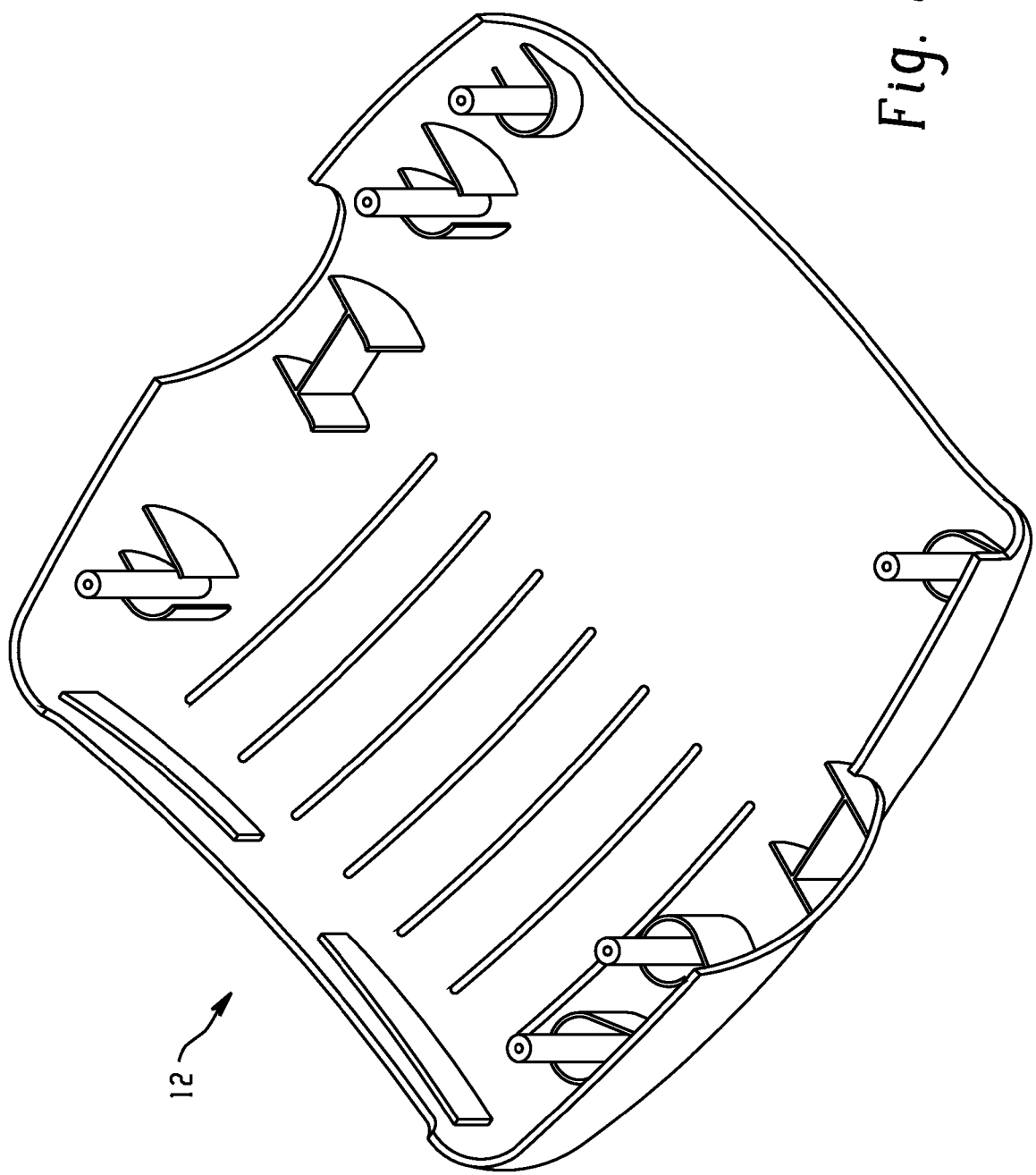
FIG. 20 is a perspective view of a plastic cover of a housing system.

Turning now to FIGS. 1, 2, and 3, a housing system is illustrated. The housing system can comprise a plastic cover 12 (see FIG. 20) and a plastic base 14 having a major axis 16 and a minor axis 18. The plastic cover 12 and the plastic base 14 can comprise any of the materials described above. The plastic base 14 can comprise a floor 20 having sidewalls 22, 24 extending from the floor 20 in a "Z" direction. Supports 95 can, optionally, extend from the floor 20 in the Z direction as illustrated in FIGS. 1 and 3. Sidewalls 22, 24 can comprise major axis sidewalls 22 (e.g., major axis first and second sidewalls 22 on either side of the major axis 16) and minor axis sidewalls 24 (e.g., minor axis first and second sidewalls 24 on either side of the minor axis 18). A first elevation 26 can also be located in the plastic base 14 wherein the first elevation 26 can be formed from first elevation walls 28 that protrude from the floor 20 in the Z direction and a first elevation bridge 41 extending between the first elevation walls 28. The first elevation walls 28 can extend along the major axis 16 from near a minor axis first sidewall 24 toward a transformer end of the base 32. The first elevation 26 can have a width 30 as illustrated in FIG. 1. The first elevation 26 can extend greater than or equal to 50% of a length of the floor 20 along the major axis 16 adjacent to a major axis first sidewall 22, specifically, greater than or equal to 60%, more specifically, greater than or equal to 70%, even more specifically, greater than or equal to 74%, and, yet more specifically still, greater than or equal to 100%. The first elevation 26 can extend along the minor axis 18 by greater than or equal to 5%, specifically, 5% to 15%, more specifically, 5% to 10% of a width of the floor 20 along the minor axis 18.

The plastic base 14 can also comprise a second elevation 34 that can be formed from second elevation walls 36 protruding from the floor 20 in the Z direction and a second elevation bridge 43 extending between the second elevation walls 36. The second elevation walls 36 can extend along the major axis 16 from near a minor axis second sidewall 24 toward a transformer end 32 of the plastic base 14. The second elevation 34 can have a width 38 illustrated by FIG. 1. The second elevation 34 can extend greater than or equal to 50% of a length of the floor 20 along the major axis 16 adjacent to a major axis second sidewall 22, specifically, greater than or equal to 60%, more specifically, greater than or equal to 70%, even more specifically, greater than or equal to 74%, and, yet more specifically still, 100%. The second elevation 34 can extend along the minor axis 18 by greater than or equal to 5%, specifically, 5% to 15%, more specifically, 5% to 10%5% of a width of the floor 20 along the minor axis 18.

The plastic base 14 can further comprise a first mounting column 40 located in the transformer end 32 of the plastic base 14 adjacent the major axis first sidewall 22 and a second mounting column 42 located in the transformer end 32 of the plastic base 14 adjacent the major axis second sidewall 22. The first and second mounting columns 40, 42 can have a top surface 44 that protrudes from the floor 20. For example, the top surface 44 can protrude a distance from the floor 20 in the Z direction in an amount greater than or equal to the elevation walls 28, 36 and the top surface 44 can be configured to receive an attachment element 46 (see FIG. 3). In another embodiment, the top surface 44 of the mounting columns 40, 42 can protrude a distance from the floor 20, in the Z direction, in an amount that is less than or equal to the elevation walls 28, 36 (e.g., the top surface 44 can be flush with the elevation walls 28, 36 or lower than the elevation walls 28, 36). Mounting columns 40, 42 can, optionally, comprise a length that extends across the entire length of the elevations 28, 36 along the major axis sidewall 22. Mounting columns 40, 42 can also, optionally comprise a length that is less than the length of elevations 28, 36 as illustrated in FIG. 1. The floor 20 can optionally comprise ventilation openings 58 to allow colder air from the atmosphere to be drawn inside the inverter housing system. The housing system can also, optionally, comprise perpendicular ribs 64 extending from the floor 20 and from the first elevation 26 to the second elevation 34 in a component end 60 the plastic base 14 and/or parallel ribs 66 extending from the floor 20 and from the first elevation 26 to the second elevation 34 in the component end 60 of the plastic base 14. Supports 95 can, optionally, be located around the ventilation openings and the transformer 72 can rest on the supports 95.

Figure 17:
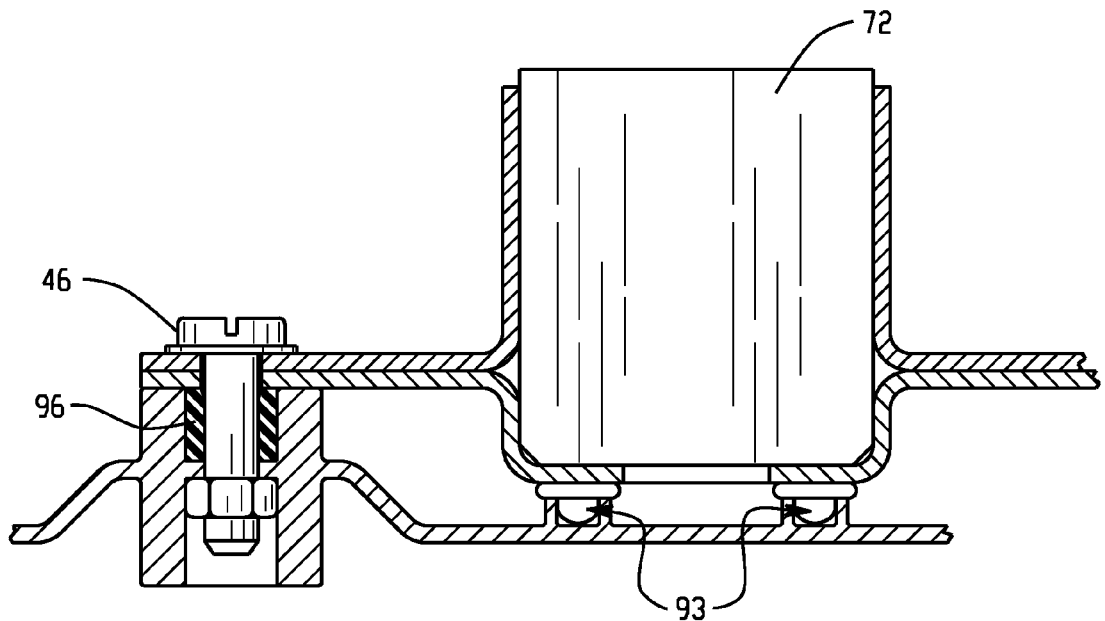
FIG. 17 is a front view of a housing system.

The mounting columns 40, 42 can transfer a static load of the transformer 72 static load to the plastic base 14, while the elevations 26, 34 can be designed to provide adequate stiffness to bear the bending moments imposed during an impact. The static weight of the transformer 72 can put the mounting columns 40, 42 in a predominantly compressive stress mode, which can be desirable because for a given temperature and stress level, the creep rate in compression mode is lower compared to the shear stress mode. A bushing 96 (see FIG. 3) can, optionally, be inserted inside a bore 48 of the mounting columns 40, 42 to absorb any mismatch between the thermal expansion of the mounting columns 40, 42 and a bracket 94 (see FIG. 3) can be used to hold the transformer 72 in place. To prevent sagging of the bracket 94 under the weight of the transformer 72, rubber stumps 93 can be provided under each bracket 94 disposed inside supports 95 to provide further support to the bracket and to maintain alignment with respect to the transformer 72 as illustrated in FIG. 17. In embodiments where the top surface 44 of the mounting columns 40, 42 protrudes from the floor 20, in the Z direction, in an amount that is less than or equal to the elevation walls 28, 36, the bracket 94 can be flush with the elevation walls 28, 36.

As previously mentioned, the predominant weight of the housing system (9 kilograms (kg)) arises from the weight of the transformer 72 (7 kg). In the scenario of an accidental fall from a distance of less than or equal to 1.0 m, it can be desirable for the housing system to absorb the energy and protect the transformer 72 and other inverter housing system components from damage (e.g., cracking and/or excessive distortion) caused by the impact of the fall. For example, when the housing system impacts (e.g., a floor), a portion (e.g., a side) of the housing system comes into contact with the floor 20 and stops moving (i.e., at zero velocity), but the transformer 72, due to momentum tries to move along the same line of fall as the housing system. Since the transformer 72 can be attached to the mounting columns 40, 42 on the housing system, it cannot move in a straight line freely and tries to rotate about its fixation points (i.e., where it is attached to the housing system) imposing shear forces and bending moments on the fixation points which are transferred to the plastic base 14 of the housing system. The bending moment is proportional to the distance between the center of gravity of the transformer 72 and the fixation point on the mounting columns 40, 42 and, depending on the direction of impact, can cause deformation (e.g., hogging or sagging) of the plastic base 14. To overcome the bending moment and retain stresses within limits (e.g., below the inverter housing system's material yield stress), elevations 26, 34 can be utilized.

The elevations 26, 34 can comprise, in cross-section, a corrugated shape, trapezoidal shape, saw tooth shape, sinusoidal shape, lamellar shape, triangular shape, abs(sin) shape, cycloid shape, and combinations comprising at least one of the foregoing shapes. The elevations 26, 34 can enhance the area of the moment of inertia and thus, can reduce the bending stress and subsequent deflection of the plastic base 14. The shape and size of the elevations 26, 34 can be based upon the bending moment or rotary kinetic energy that needs to be absorbed while keeping the stress below the yield point.

Figure 18:
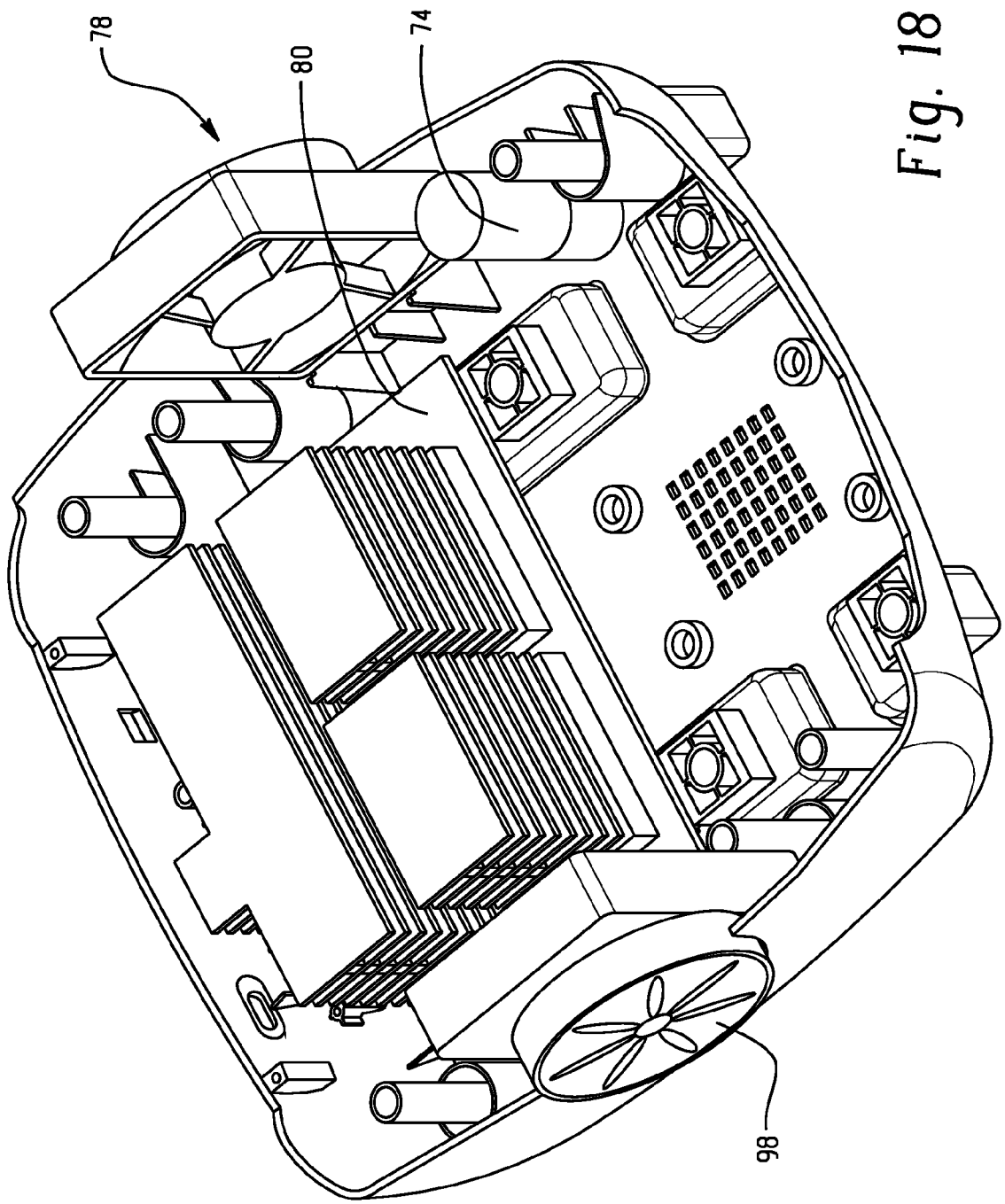
FIG. 18 is a perspective view of the internal components of a housing system.

Other components of the housing system that can, optionally, be present include, but are not limited to, a transformer 72 (see FIG. 5), having a weight of 5 to 10 kilograms, physically attached to the mounting columns 40, 42, a capacitor 74 (see FIG. 18) extending into a split cylinder 76, a fan 78 (see FIG. 10 or FIG. 18), fan cover 98 (see FIG. 18) and a printed circuit board 80 (see FIG. 18).

As illustrated in FIGS. 1 and 2, the mounting columns 40, 42 can have a bore 48 extending from the top surface 44 into, and optionally through, the mounting columns 40, 42, which is dimensioned to receive the attachment element 46 (see FIG. 3), where the mounting columns 40, 42 has structural ribs 50 extending from the bore 48 to an edge of the mounting columns 40, 42. The first and second mounting columns 40, 42 can, optionally, comprise mounting column ribs 70. A first elevation bridge 41 and a second elevation bridge 43 can form a flat plateau having a constant distance in the Z direction from the floor 20. The housing system can be configured to receive a transformer (e.g., having a weight of greater than or equal to or less than or equal to 7 kilograms), and after being assembled with the internal electronics (e.g., transformer, PCB, capacitors, fan, etc.), the housing system can be closed by attaching a plastic cover 12 to a plastic base 14.

The inverter housing system has enhanced structural integrity, e.g., as is evidenced by a structural impact test (SIT). The SIT includes surrounding the assembled inverter housing system with expandable polystyrene (EPS) packing material, enclosing the housing system and packing material in a six sided, cardboard container having a wall thickness of 3 mm, specifically, 2 mm. The container is then dropped from a height of 1.0 meter (m) onto a carpeted surface with concrete under the carpet on each side of the container. After the container has been dropped so that all sides contact the surface, the container is opened and the inverter housing system and internal components of the inverter housing system are visually observed for any damage. With the inverter housing systems disclosed herein, no visible damage occurs to the inverter housing or the internal components located therein. In embodiments where the packing material is not present, the inverter housing system can withstand a fall from a distance of 0.75 m (e.g., a distance of less than or equal to 0.75 m) with no visible damage to the inverter housing or the internal components located therein.

The first elevation 26 and/or the second elevation 34 can also, optionally, have an elevation perpendicular rib 62 extending from the first elevation bridge 41, between the elevation walls 28, 36. The first elevation 26 and/or the second elevation 34 can also, optionally, have an elevation parallel rib 68 extending from an elevation perpendicular rib 62 to another elevation perpendicular rib 62 or to a sidewall 22, 24. Optionally, the housing system can comprise perpendicular ribs 64 extending from the floor 20 and from the first elevation 26 to the second elevation 34 in the component end 60 and/or parallel ribs 66 extending from perpendicular rib 64 to perpendicular rib 64 in the component end 60. The ribs as described herein can aid in the prevention of collapsing or buckling when the plastic base 14 is subjected to forces perpendicular to the elevation extrusion direction. Alternatively, in lieu of the parallel ribs 66 and perpendicular ribs 64, additional elevations that can be equivalent to or smaller in size than elevations 26, 34 can be located on the floor 20 of the plastic base 14 parallel to the minor axis 18. Such elevations can help in preventing collapsing or buckling of the inverter housing system when subjected to forces that are perpendicular to the elevation extrusion direction.

The housing system illustrated in FIGS. 1 to 3 can have a greater than or equal to 35% reduction in maximum stress as compared to the same housing system without elevations 26, 34, specifically, greater than or equal to 45%, and even more specifically, greater than or equal to 55%. The housing system in FIGS. 1 to 3 can also have a greater than or equal to 25% reduction in deformation as compared the same housing system without elevations 26, 34, specifically, greater than or equal to 35%, even more specifically, greater than or equal to 40%, and even more specifically, greater than or equal to 44%.

The overall dimensions of the housing system can include a width (e.g., along the minor axis 18) of greater than or equal to 125 millimeters (mm), specifically, greater than or equal to 150 mm, more specifically, greater than or equal to 200 mm, still more specifically, greater than or equal to 250 mm, and even more specifically, greater than or equal to 300 mm. The length (e.g., along the major axis 16) can be greater than or equal to 100 mm, specifically, greater than or equal to 150 mm, more specifically, greater than or equal to 200 mm, still more specifically, greater than or equal to 250 mm, even more specifically, greater than or equal to 300 mm, and yet more specifically still, greater than or equal to 325 mm. The housing system can comprise a height (e.g., in the Z direction) of greater than or equal to 50 mm, specifically, greater than or equal to 60 mm, more specifically, greater than or equal to 75 mm, even more specifically, greater than or equal to 90 mm, and still more specifically, greater than or equal to 95 mm.

The elevations 26, 34 can have a length at the start point of the elevations 26, 34 of greater than or equal to 25 mm, more specifically, greater than or equal to 35 mm, and even more specifically, greater than or equal to 45 mm, while the width at the top of the elevations 26, 34 can be less than or equal to 5% of the length at the start point of the elevations 24, 36. The height of the elevations 24, 36 can be greater than or equal to 5 mm, more specifically, greater than or equal to 10 mm, and even more specifically, greater than or equal to 15 mm.

Figure 4:
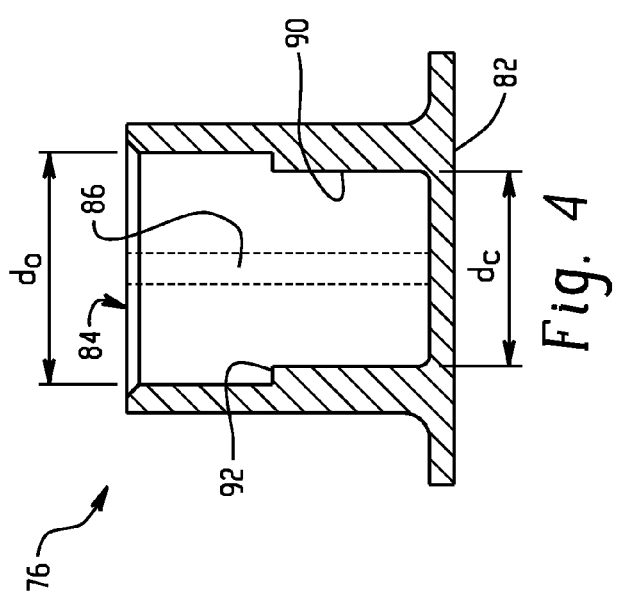
FIG. 4 is a front view of a split cylinder of the plastic base of FIG. 1.
Figure 5:
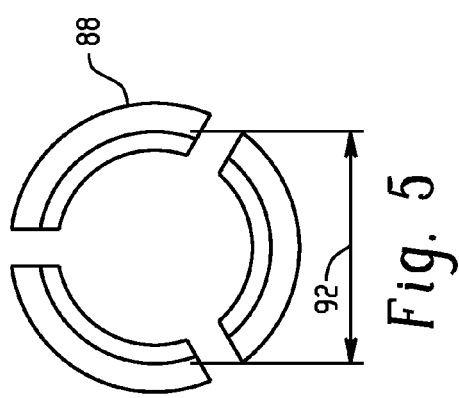
FIG. 5 is a top view of a component of the split cylinder of FIG. 4.

The plastic base 14 can also, optionally, comprise a split cylinder 76 as illustrated in FIGS. 3, 4, and 5. The split cylinder 76 can have a connected end 82 attached to the floor 20 and an open end 84 opposite the connected end 82. The connected end 82 and the open end 84 can have different diameters to account for different sizes of the capacitor 74. For example, the connected end 82 can have a diameter $d_c$, and the open end 84 can have a diameter, $d_o$, wherein $d_c$ is less than $d_o$. The split cylinder 76 can also have at least two slits 86 extending from the open end 84 to the connected end 82, specifically, greater than or equal to three slits 86. The split cylinder 76 can also, optionally, comprise an annular ring 88, where the split cylinder 76 changes from $d_o$ to $d_c$ with the annular ring 88. Alternatively, the split cylinder 76 can change from $d_c$ to $d_o$ at a ledge 92 having an angle of 85° to 115° to a side 90 of the split cylinder 76.

The housing system can have greater than or equal to three different size capacitors 74 mounted therein. The capacitors 74 could vary in diameter of 20 mm to 30 mm. For example, one capacitor 74 could have a diameter of 24 mm, another 26.5 mm, and the third, 27 mm where the height remains constant between all the capacitors 74. As illustrated in FIG. 4, a split cylinder 76 can be stepped internally to accommodate different sizes of the capacitor 74. By cutting the split cylinder 76 along its length, the split cylinder 76 can flex diametrically outward and hold the capacitors 74 in place by elastic properties. By having the cuts along the length of the split cylinder 76, it can be possible to account for different size capacitors 74 without creating excessive stresses in the housing system.

Figure 6:
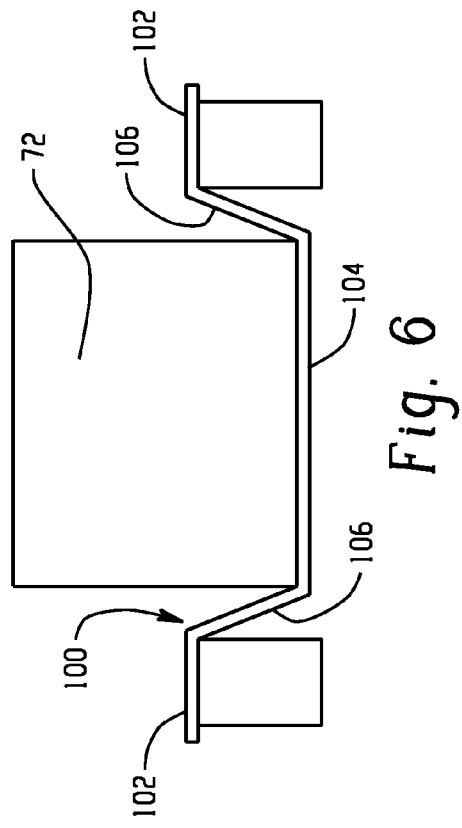
FIG. 6 is a front view of a center of gravity bracket.
Figure 7:
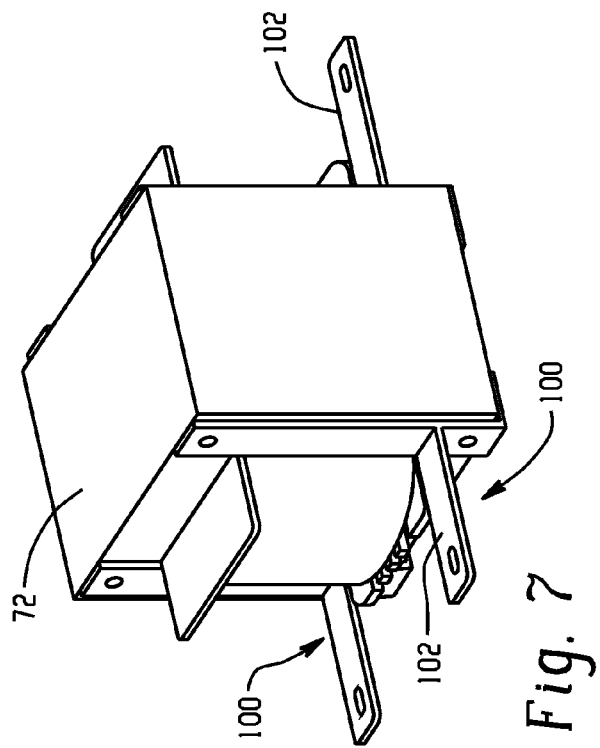
FIG. 7 is a perspective view of a transformer and center of gravity bracket assembly.
Figure 21:
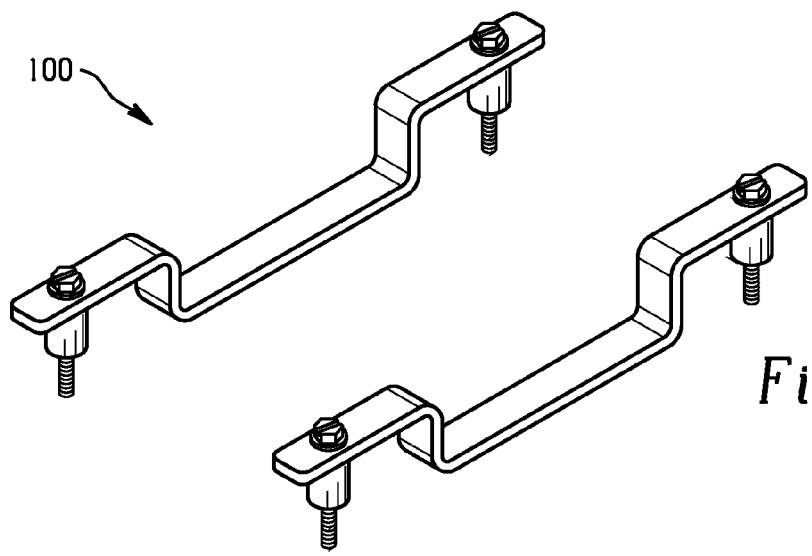
FIGS. 21, 22, and 23 are perspective views of various designs for mounting brackets.
Figure 22:
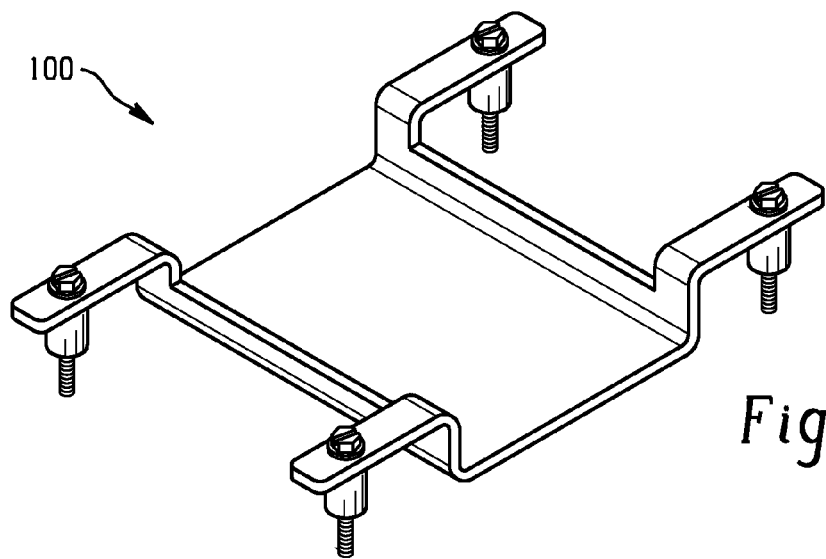
Figure 23:
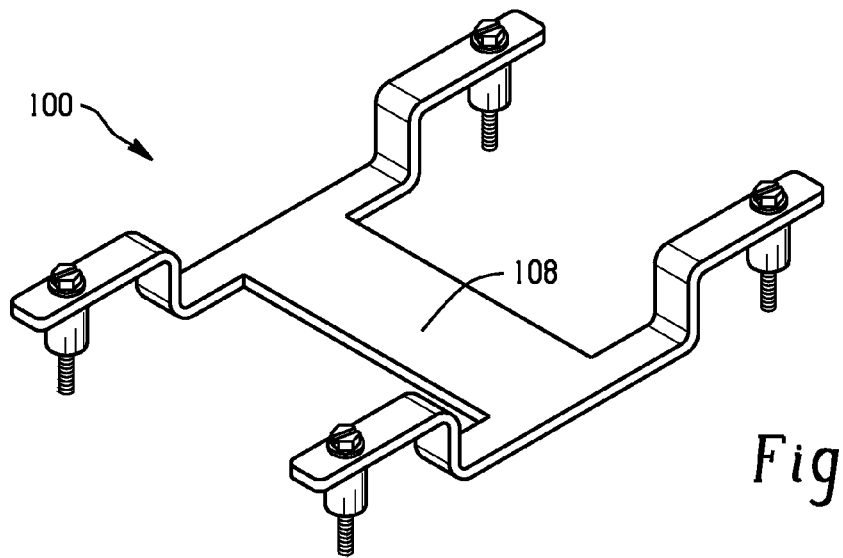

Turning now to FIGS. 6 and 7, a center of gravity bracket 100 is illustrated. The center of gravity bracket 100 can be introduced to lower a bending moment of the transformer 72. Generally, the center of gravity bracket 100 functions to transfer the dead weight of the transformer 72 to the mounting columns 40, 42. The center of gravity bracket 100 can have connector lips 102 configured to attached to the top surface 44 of the mounting columns 40, 42, a platform 104 located between the connector lips 102 having a length and width to receive a transformer 72, and a bracket wall 106 on opposite sides of the platform 104 extending from an edge of the platform 104 to the lip 102. When the lips 102 are attached to the mounting columns 40, 42, the bracket wall 106 can extend from the lips 102 toward the floor 20. Other embodiments of the center of gravity bracket 100 are illustrated in FIGS. 21 to 23. The center of gravity brackets 100 can be attached to either the bottom or the top of the transformer 72. FIGS. 22 and 23 illustrate embodiments in which two center of gravity brackets 100 are attached with a connecting portion 108. In FIG. 22, the connecting portion 108 has a constant width from center of gravity bracket 100 to the other center of gravity bracket 100, while in FIG. 23 the width of the connecting portion 108 narrows from one end of the center of gravity bracket 100 to the other end of the center of gravity bracket 100.

As illustrated in FIGS. 6 and 7, the placement of the center of gravity bracket 100 on the transformer 72 can be adjusted to effectively lower the center of gravity by reducing the distance between the center of gravity of the transformer 72 and the attachment element 46. This design can result in a reduced bending moment and consequently, reduced transformer 72 and plastic base 14 rotations. For example, the housing system can have a greater than or equal to 5% reduction in maximum stress as compared to the same housing system without a center of gravity bracket 100, specifically, greater than or equal to a 9% reduction. The inverter housing system can also have a 15% reduction in deformation as compared to an inverter housing system with a flat base, specifically, greater than or equal to 20% reduction.

Referring again to FIGS. 1 and 2, the housing system can further comprise a third mounting column 52 located in the transformer end 32 of the plastic base 14 adjacent the major axis first sidewall 22 and the minor axis first sidewall 24 and a fourth mounting column 54 located in the transformer end 32 of the plastic base 14 adjacent the major axis second sidewall 22 and the minor axis first sidewall 24. The third and fourth mounting columns 52, 54 can, optionally, comprise mounting column ribs 70. As with mounting columns 40, 42, mounting columns 52, 54 can be mounted in the center of the elevations 27, 35 or biased toward either side of the elevations 27, 35. When third and fourth mounting columns 52, 54 are present, the top surface 44 of the third and fourth mounting columns 52, 54 can be level with the top surface 44 of the first and second mounting columns 40, 42, or the top surface 44 of the third and fourth mounting columns 52, 54 can be higher than the top surface 44 of the first and second mounting columns 40, 42 (i.e., there is an upward incline from the first and second mounting columns 40, 42 and the third and fourth mounting columns 52, 54), or the top surface 44 of the first and second mounting columns 40, 42 can be higher than the top surface 44 of the third and fourth mounting columns 52, 54 (i.e., there is a downward incline from the first and second mounting columns 40, 42 to the third and fourth mounting columns 52, 54).

Figure 8:
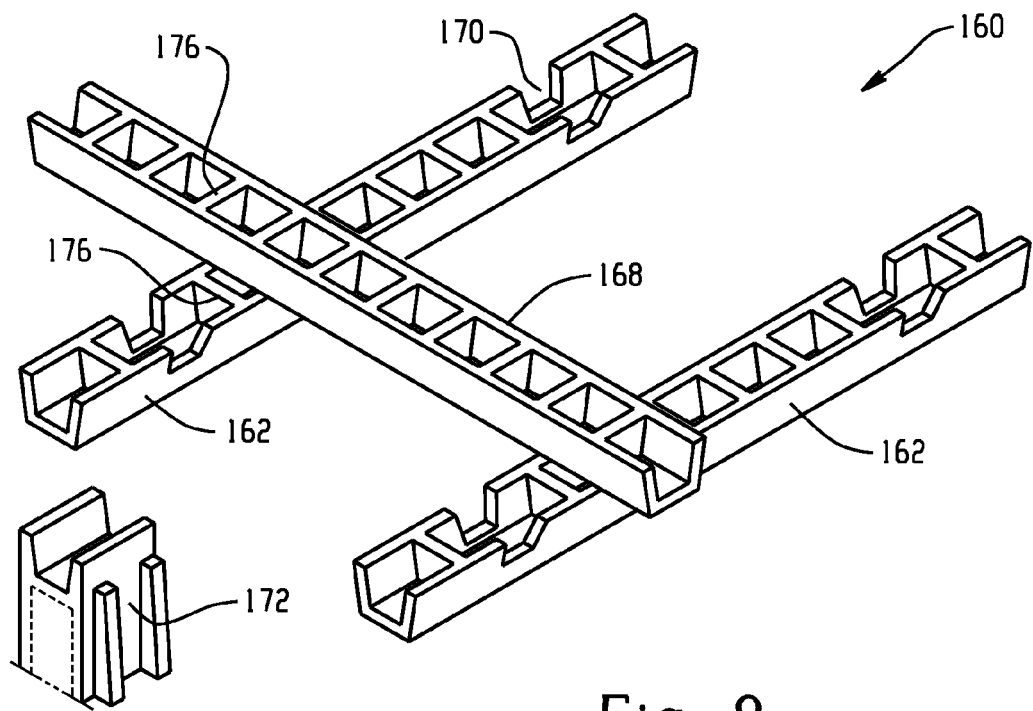
FIG. 8 is a perspective view of a beam assembly in a housing system.
Figure 9:
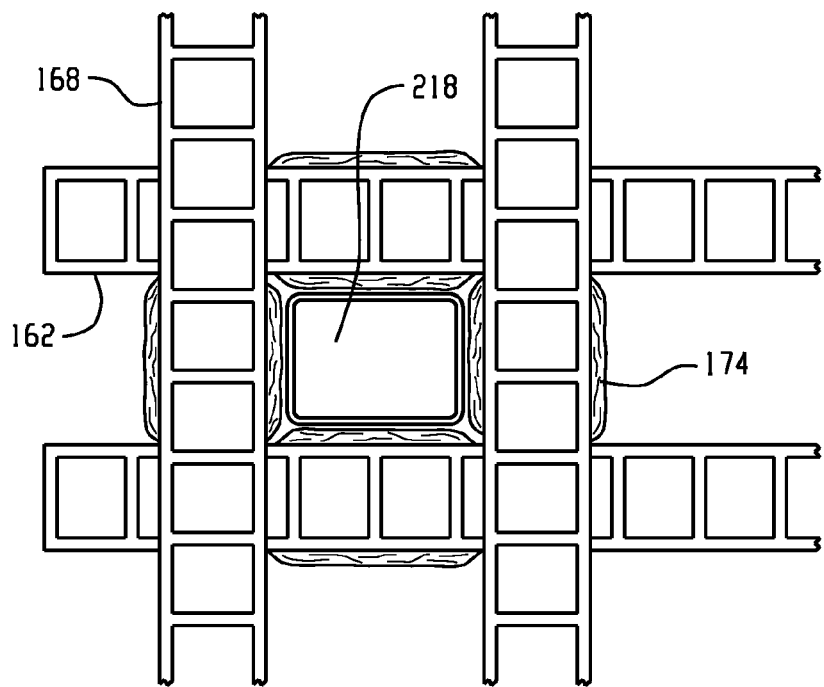
FIG. 9 is a top view of a beam assembly in a housing system.
Figure 10:
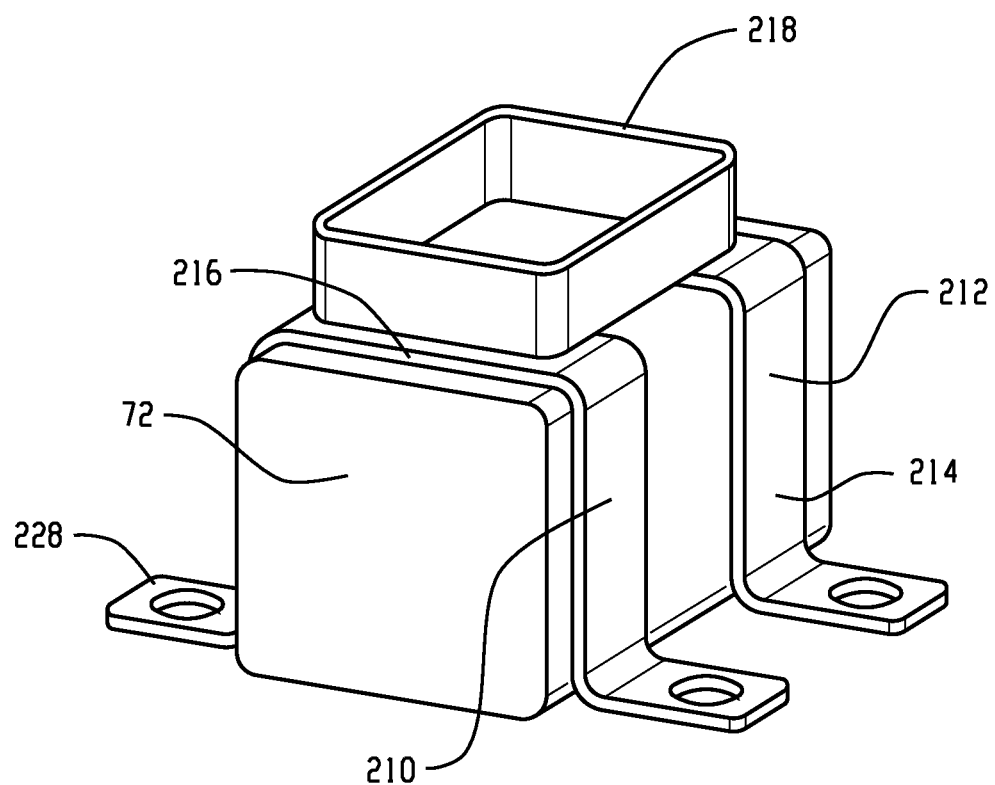
FIG. 10 is a perspective view of a clamp of the beam assembly of FIG. 8.

As illustrated in FIGS. 8, 9, and 10 a beam assembly 160 can also, optionally, be used with the various embodiments herein, to provide structural reinforcement to the housing system and rotation resistance to a transformer mounted therein. The beam assembly 160 comprises a major axis beam 168 that can extend along the major axis sidewall 22 in the transformer end 32 of the plastic base 14 and a minor axis beam 162 that can extend along the minor axis sidewall 24 in the transformer end 32 of the plastic base 14. Beam assembly 160 can surround transformer attachment 218 to help control or restrict transformer rotation in the event of a fall. FIGS. 8 and 9 illustrate that a frame can be formed through the interaction of the major axis beam 168 and the minor axis beam 162, e.g., wherein one beam is mated with slots on the other beam that can be attached to a support member(s) 172 (e.g., where the minor axis beam 162 can be supported in slots 170 on the major axis beam 168, with the minor axis beam 162 supported on either end by a support member 172.) The support member 172 can be attached to the plastic base 14 (e.g., to the floor 20 and/or to a side wall), such as extending from the plastic base 14 upward in the Z direction. The major axis beam 168 and the minor axis beam 162 can comprise any plastic material as previously described herein.

FIG. 10 illustrates first and second mounting brackets 210, 212 disposed over transformer 72, where the mounting brackets 210, 212 can be connected to the floor of the plastic base 14, e.g., near the minor axis sidewall 24 in the transformer end 32. For example the mounting brackets can attach to the floor 20 or a column 40, 42, 52, 54, such that the transformer is located over the supports 95 with optional rubber stumps 93 located into the supports 95. Disposed on top of the mounting brackets 210, 212 can be a transformer attachment 218. The transformer attachment 218 can have a geometry to mate with the beam assembly 160, e.g., can comprise a generally square shape.

Compliant member 174 (e.g., a rubber bushing) can be disposed underneath and attached to the major axis beam 168 and the minor axis beam 162 such that the compliant member 174 forms a frame around transformer attachment 218. Major axis beam 168 and minor axis beam 162 can comprise rib members 176 to provide structural reinforcement to the major axis beam 168 and the minor axis beam 162. If the housing system falls or is dropped, and the transformer 72 tries to rotate, the rotation can be resisted by compliant member 174 and also by the frame formed by the major axis beam 168 and the minor axis beam 162. The major axis beam 168 and the minor axis beam 162 transfer the floor rotations and displacement into the plastic base 14. The compliant member 174 can deform to aid in energy absorption and the plastic base 14 major axis sidewall 22 and minor axis sidewall 24 can also aid in energy absorption. The compliant member 174 can be located around the outside of the transformer attachment 218, effectively forming a frame like enclosure around the transformer attachment 218 to prevent rotation of the transformer 72 if dropped.

The designs illustrated in FIGS. 8, 9, and 10 can reduce stress by greater than or equal to 10%, specifically, greater than or equal to 15%, and even more specifically, greater than or equal to 20% and can also reduce deformation by greater than or equal to 35%, specifically, greater than or equal to 38%, and even more specifically, greater than or equal to 40%, all as compared to the same housing system with the beam assembly 160.

Figure 19:
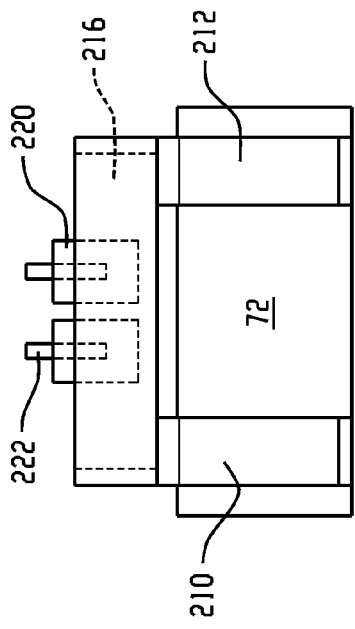
FIG. 19 is a front view of the assembly of FIG. 11.
Figure 12:
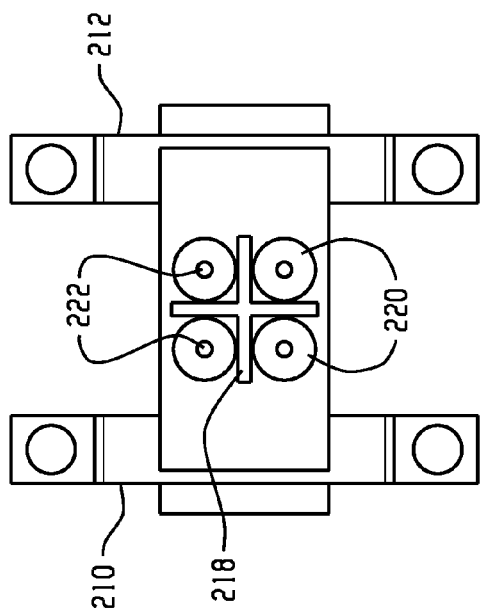
FIG. 12 is a top view of the assembly of FIG. 11.
Figure 11:
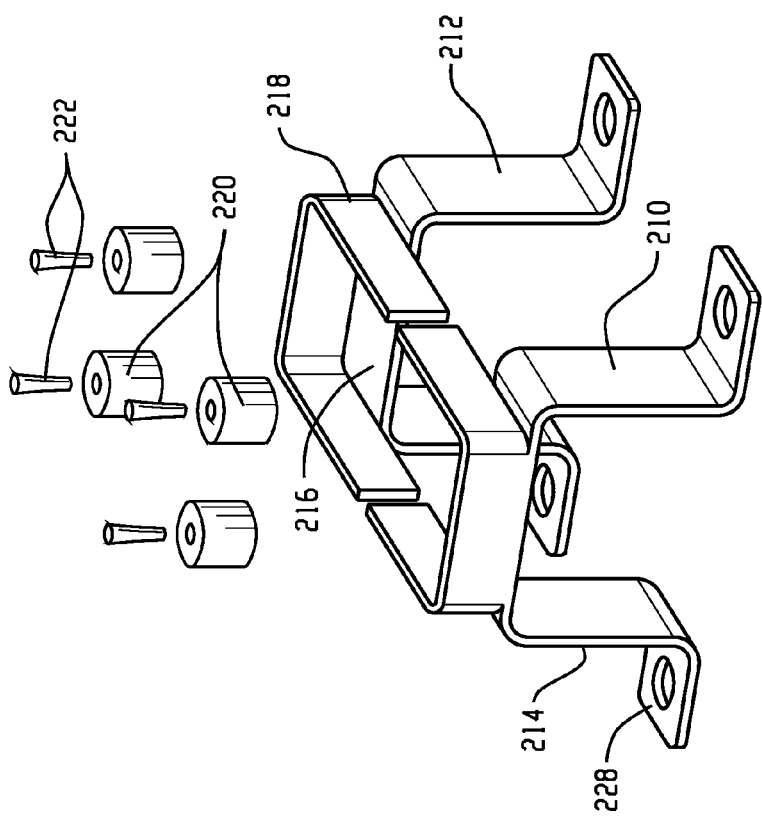
FIG. 11 is a perspective view of a mounting bracket for a housing system.

FIGS. 11, 12, and 19 illustrate another embodiment of an impact absorbing concept for a housing system. First and second mounting brackets 210, 212 can be attached to the floor 20 (e.g., near the minor axis sidewall 24 in the transformer end 32 of the plastic base 14), where the first and second mounting brackets 210, 212 comprise vertically extending walls 214 extending in a direction from the floor 20 having an attachment portion 228 extending toward the major axis sidewalls 22, and a connecting wall 216 between the vertically extending walls 214. Extending from the connecting wall 216, away from the floor (e.g., toward the cover), is a transformer attachment 218. The transformer attachment 218 can comprise a metallic material and can comprise any geometry that can assist in inhibiting rotation of the transformer during a fall. Examples of shapes include a C shape (see FIG. 11), a box shape (see FIG. 10), a cross shape (see FIG. 12), and combinations comprising at least one of the foregoing.

Extending from the plastic cover 12 can be a cover extension member 222 which fits into an opening located in a compliant member 220 disposed between the cover extension member 222 and the transformer attachment 218. The cover extension member 222 can be hollow or solid and can, optionally, comprise reinforcing ribs. Symmetric cross sections for the cover extension members 222 can provide equal resistance during transformer moments. Unsymmetrical cross sections can also give energy absorption, but will give unequal resistance in different directions. The compliant member 220 can be any shape such as circular, square, rectangular, elliptical, trapezoidal, etc., as well as combinations comprising at least one of the forgoing.

In one embodiment, the cover extension member 222 and the compliant member 220 can have an internal arrangement, meaning that the cover extension member 222 and the compliant member 220 can be arranged to be within the shape of the transformer attachment 218 (see FIG. 12). In an alternative embodiment, the cover extension member 222 and the compliant member 220 can have an external arrangement, meaning that the cover extension member 222 and the compliant member 220 can be arranged to be outside the shape of the transformer attachment 218. The compliant member 220 and the cover extension member 222 can comprise an elastomeric material (e.g., rubber), a thermoplastic material as described above with respect to the housing system material, or can comprise a spring (e.g., a metallic spring or a leaf spring (i.e., a curved or twisted metallic spring). The number of cover extension members 222 and the compliant members 220 can be any number that will provide the desired properties, such as energy absorption to the housing system. For example, the number of compliant members 220 and cover extension members 222 can be greater than or equal to 1, specifically, greater than or equal to 2, more specifically, greater than or equal to 3, and even more specifically, greater than or equal to 4. The cover extension member 222 and the compliant member 220 aid in resisting transformer 72 rotation when the housing system suffers a fall or other impact.

Turning now to FIGS. 13 through 16, thermal management concepts to prevent the formation of hotspots on the inverter housing system are illustrated. Based upon the geometry of the housing system, certain sections of the inverter housing system can be exposed to high convective and radiative load due to the proximity to the transformer 72 which is a heat source. Temperatures at the core of the transformer 72 can reach temperatures of 115° C. Using Computational Fluid Dynamics (CFD), it is possible to identify the locations of hot spots on the inverter housing system where the temperature of the inverter housing system can reach temperatures of 80° C. to 90° C. The concept illustrated in FIGS. 13 to 16 can protect the inverter housing system from reaching these high temperatures and thus, can prevent the formation of hotspots in the inverter housing system and also prevent weakening of the inverter housing system due to exposure to these high temperatures.

As illustrated in FIGS. 13 and 14, a vapor plate 110 can also, optionally, be used with the various embodiments herein. The vapor plate 110 can comprise a heat transfer wall 112 and a release wall 114, where the heat transfer wall 112 can be configured to be located adjacent to a transformer 72. The release wall 114 can comprise heat exchange fins 116 across its surface and a fluid and capillary wick material can be located between the heat transfer wall 112 and the release wall 114 such that in use, the material can absorb heat from the transformer 72 by changing to a vapor, migrate to the release wall 114 where it cools to a liquid, releasing heat, and can then be wicked back to the heat transfer wall 112. For example, the capillary wick material can comprise a powder (e.g., sintered metal) or a composite wick structure. The vapor plate 110 can, optionally, further comprise a thermally conductive paste 118 in contact with both the transformer 72 and the heat transfer wall 112. The heat exchange fins 116 can be oriented in a direction perpendicular to the airflow 120 through the housing system.

The vapor plate 110 can comprise a metallic material or a thermoplastic material as previously described. The vapor plate 110 can be attached to the housing system (e.g., attached to the floor 20 of the plastic base 14) with bolts, screws, etc. The vapor plate 110 and heat exchange fins 116 can provide an increased surface area on the housing system, which allows for more efficient removal of heat from the transformer 72. The vapor plate 110 can have a thickness of 3 mm to 10 mm, specifically, 4 mm to 8 mm, and even more specifically 5 mm to 7 mm. In one embodiment, the vapor plate 110 can have a thickness of 6 mm. In one embodiment, the vapor plate 110 can be hollow. In that case, a vacuum can be created inside the vapor plate 110 and the vapor plate 110 can be filled with a fluid to facilitate heat removal from the transformer 72. Exemplary materials for the fluid include, but are not limited to, water, acetone, nitrogen, ammonia, methanol, and so forth, as well as combinations comprising at least one of the foregoing. The inside of the vapor plate 110 can be coated with a capillary wick material, which creates the capillary action for the fluid to rise upward toward the heat source on the top of the vapor plate 140. The vacuum created boils the fluid at a lower temperature compared to atmospheric pressure to cause a phase change (e.g., from a liquid to a gas), which moves the gas down to the cooler regions of the vapor plate 110 and allows the gas to be converted back to a liquid via condensation. This condensed fluid rises inside the vapor plate 110 due to capillary action, toward the heat source on the top of the vapor plate 110 and the cycle repeats itself. As a result, the heat generated by the transformer 72 can be removed.

In FIG. 13, the vapor plate 110 is shown attached directly to the transformer 72. The vapor plate 110 can be attached to the transformer 72 as described above with respect to the housing system or can be attached via other attachment elements, such as the use of a thermally conductive paste 118. The thermally conductive paste 118 can be selected to have good thermal conductivity so that heat can be exchanged from the transformer 72 to the vapor plate 110. The vapor plate 110 can be mounted such that it is in line with the air path (e.g., a forced convection air path 120 as illustrated in FIG. 13), created by a fan 78 that is mounted on a side of the plastic base 14 of the inverter housing system (see FIG. 18). For example, the thermally conductive paste 118 can comprise a silicone compound, a silver thermal compound, as well as combinations comprising at least one of the foregoing. The thermal conductivity of the thermally conductive paste 118 can be 0.5 to 10 W/mK, specifically 0.7 to 3 W/mK for silicone compounds and 3 to 8 W/mK for silver thermal compounds.

Turning now to FIG. 15, a thermal management concept that can optionally be used with the various embodiments herein for a housing system is illustrated. A minor axis sidewall 24 in the transformer end 32 of the plastic base 14 can comprise a metal sheet 140 on an inner surface 142 of the minor axis sidewall 24 in an area located adjacent the transformer 72 when in use and the metal sheet 140 can also comprise a thermally insulating material 146 between the metal sheet 140 and the plastic of the minor axis first or second sidewall 24. Placement of the metal sheet 140 on the housing system is generally located at a hotspot on the housing system which can be predicted by CFD or by experimentation. The metal sheet 140 can, optionally, comprise corrugations 144 that are generally located in the portion of the metal sheet 140 closest to the hot spots on the housing system to reduce the heat load to the housing system. The thermally insulating material 146 can also, optionally, comprise corrugations 144 that are complimentary to the corrugations 144 on the metal sheet 140. An outer surface of the metal sheet 148, for example, of the metal sheet 140 facing the heat source located opposite the thermally insulating material 146 on the metal sheet 140 can, optionally, be polished. The metal sheet 140 can comprise a material such as aluminum, copper, and combinations comprising at least one of the foregoing. The gap illustrated in FIG. 15 between the metal sheet 140 and the thermally insulating material 146 is for illustration purposes only and in practice the gap can be negligible (e.g., the metal sheet 140 and the thermally insulating material 146 can be so close as to touch one another). Corrugations 144 on the metal sheet 140 allow for insertion of the thermally insulating material 146 corrugations 144 onto the metal sheet 140 corrugations 144. Thermally insulating material 146 can reduce the number of points of contact between the thermally insulating material 146 and the sidewall 24, which helps in reducing the heat load to the housing system. Since an unexposed plastic part can be subjected to heat from radiation and convection, in an embodiment, the corrugations 144 can, optionally, be locally polished (e.g., on the inner surface 142). Polishing can help reduce some of the incident heat by reflecting it and acting as a shield between the inverter housing system hotspot and transformer 72, thereby reducing the radiation component.

The metal sheet 140, with corrugations 144 and optional thermally insulating material 146 can increase the thermal resistance in the direction of the hotspot. Thus, a large portion the incident heat on the metal sheet 140 can be dissipated along the length of the metal sheet 140 to areas of the housing system where forced convection is available only through fan 78. Heat from the metal sheet 140 can be transferred to the thermally insulating material 146 by conduction at points of contact only. Since there can be a small gap (e.g., an air gap) between the metal sheet 140 and the thermally insulating material 146, the heat transfer between the metal sheet 140 and the thermally insulating material 146 is low as compared to the heat transfer along a thermally conductive metal sheet 140 cooled by convective air currents.

Figure 16:
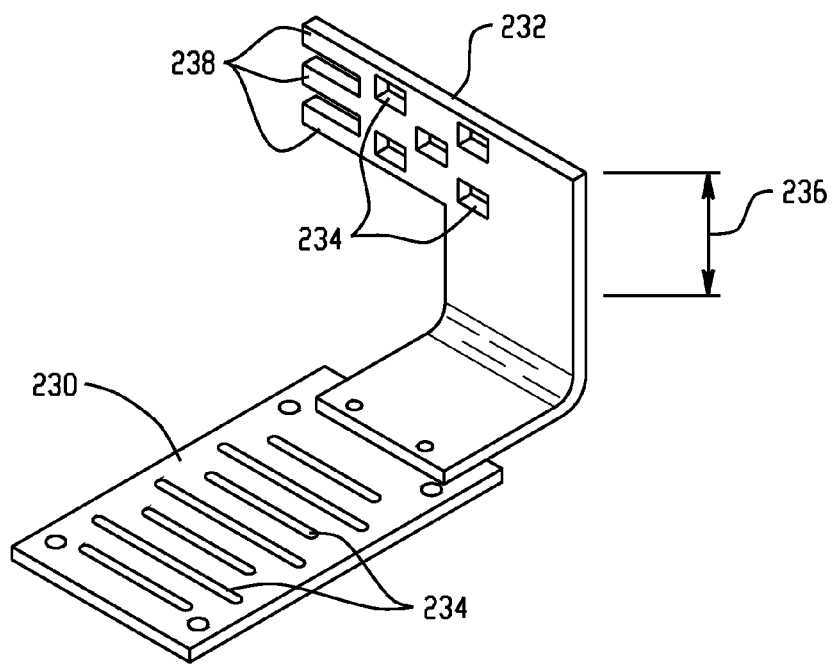
FIG. 16 is a perspective view of a mounting plate and dissipater plate for a housing system.

Turning now to FIG. 16, another thermal management concept that can optionally be used with the various embodiments described herein for a housing system is illustrated. Here, thermal siphoning can be employed to help remove heat from a mounting plate 230. The transformer 72 can be mounted on the housing system by placing it on the mounting plate 230. The mounting plate 230 is attached to housing system through the use of various attachment elements such as screws. A mounting plate 230 can be attached to the first and second mounting columns 40, 42, where the mounting plate 230 can comprise openings 234 on a surface of the mounting plate 230 and the mounting plate 230 can also comprise a dissipater plate 232 attached to the mounting plate 230 on an end, where the dissipater plate 232 extends outward and protrudes upward from the mounting plate 230. The dissipater plate 232 can comprise a top portion 236 extending in the direction of the major axis 16 where the top portion 236 comprises openings 234 and heat dissipating fins 238 on a side of the top portion 236.

Exemplary materials for the mounting plate 230 include those having a thermal conductivity of greater than or equal to 25 W/mK, such as copper, steel, and so forth. Exemplary materials for the dissipater plate 232 include those having a thermal conductivity of greater than or equal to 350 W/mK, such as copper. Other materials that can be used for the mounting plate 230 and the dissipater plate 232 can include Konduit* resins, which are commercially available from SABIC Innovative Plastics. The dissipater plate 232 can be connected to the mounting plate 230 such that there are no air gaps between them. When the inverter is in a working state, the heat from the transformer 72 can be passed to the mounting plate 230 by conduction. The mounting plate 230 can then pass the heat on to the dissipater plate 232. The shape of the dissipater plate 232 can be such that it extends along the periphery of the housing system where the transformer 72 is attached to a cooling fan 78. As a result, one end of the dissipater plate 232 can be relatively cool compared to the end attached to the mounting plate 230, thus creating a thermal wick action (e.g., a siphon) drawing heat from the mounting plate 230 to the cool end of the dissipater plate 232. Heat can then be taken from the transformer 72 and released to the ambient air. The dissipater plate 232 can have a smooth aerodynamic shape and can be aligned along the minor axis 18 in the direction of the air flow in such a way that minimizes drag and shows a larger surface area to the convective currents of the fan 78 flowing over it. The dissipater plate 232 can also be aligned in the inverter housing system so that a larger surface area faces the convective currents of the fan 78.

The following examples are merely illustrative of the device disclosed herein and are not intended to limit the scope hereof. Unless otherwise specified, all of the following examples were based upon simulations.

EXAMPLES

Unless otherwise specified, ABAQUS* computer simulation software is utilized to conduct tests for the inverter housing system designs disclosed herein. Polycarbonate (PC) siloxane resin is used for the inverter housing system material (i.e., Lexan* ML6412), which is a high flow opaque injection molding (IM) grade with very low temperature ductility characteristics. This resin has a UL94 rating of V0 @ 1.5 mm and a rating of 5VA @ 3.0 mm for flame retardancy based on non-chlorine, non-bromine flame retardant systems. Polycarbonate siloxane resin also offers excellent processing characteristics with the opportunity for shorter injection molding cycle times compared to other PC resins. This resin is available in a wide range of opaque colors and is an excellent candidate for a wide range of electrical applications. Lexan* ML6412 has a flexural modulus of 2,600 mega Pascals (MPa) as tested according to ASTM D790 and a notched impact strength of 900 Joules per meter (J/m) as tested according to ASTM D 256.

Example 1

Simulations are conducted with the plastic base 14 design illustrated in FIGS. 1 to 3. The results indicate that the plastic base 14 illustrated in FIGS. 1 to 3 has a greater than or equal to 35% reduction in maximum stress as compared to the same plastic base without the elevations 26, 34, specifically, greater than or equal to 45%, and even more specifically, greater than or equal to 55%. The plastic base 14 in FIGS. 1 to 3 also has a greater than or equal to 25% reduction in deformation as compared to the same plastic base without the elevations 26, 34, specifically, greater than or equal to 35%, even more specifically, greater than or equal to 40%, and even more specifically, greater than or equal to 44%.

Example 2

Simulations are conducted using the center of gravity bracket 100 illustrated in FIGS. 6 and 7 and plastic base 14 illustrated in FIG. 1 using the same materials as described with respect to Example 1. The results demonstrate a reduced bending moment and consequently, reduced transformer 72 and plastic base 14 rotation. For example, a design with the center of gravity bracket 100 and plastic base 14 have a greater than or equal to 5% reduction in maximum stress as compared to the same plastic base without the center of gravity bracket or elevations (i.e., with brackets that are flush with the floor of the plastic base, with no elevations), specifically, greater than or equal to 9% reduction. The center of gravity bracket 100 and plastic base 14 also has a 15% reduction in deformation as compared to the same plastic base without the center of gravity bracket or elevations (i.e., a flat base), specifically, greater than or equal to 20% reduction.

Example 3

Simulations are conducted with the design illustrated in FIG. 11 using the same materials as described with respect to Example 1. The results indicate that the design illustrated in FIG. 11 provides a greater than or equal to 20% reduction in maximum stresses, specifically, greater than or equal to 25%, more specifically, greater than or equal to 27%, and even more specifically, greater than or equal to 30% as compared to a design having a plastic base with brackets but no elevations, without the transformer attachment, complaint member, or cover extension member of FIG. 11 (e.g., the brackets attach to the floor). The design in FIG. 11 also provides a greater than or equal to 25% reduction in deformation, specifically, greater than or equal to 30%, more specifically, greater than or equal to 35%, even more specifically, greater than or equal to 38%, and yet more specifically, greater than or equal to 45%, as compared to a design having a plastic base with brackets but no elevations, without the transformer attachment, complaint member, or cover extension member of FIG. 11.

Example 4

Simulations were also conducted for the beam assembly 160 design illustrated in FIGS. 8, 9, and 10 using the same materials and plastic base 14 as described with respect to Example 1. The results indicate that stress is reduced by greater than or equal to 10%, specifically, greater than or equal to 15%, and even more specifically, greater than or equal to 20% and deformation is reduced by greater than or equal to 35%, specifically, greater than or equal to 38%, and even more specifically, greater than or equal to 40 as compared to a plastic base without elevations or the beam assembly 160 design.

In one embodiment, a housing system, comprises: a plastic cover (12); a plastic base (14) having a major axis (16) and a minor axis (18), wherein the plastic base (14) comprises a floor (20) having sidewalls (22, 24) extending from the floor in a "Z" direction; a first elevation (26) formed from first elevation walls (28) protruding from the floor (20) in the Z direction and a first elevation bridge (41) extending between the first elevation walls (28), wherein the first elevation walls (28) extend along the major axis (18) from near a minor axis first sidewall (24) toward a transformer end of the base (32), wherein the first elevation (26) extends greater than or equal to 70% of a length of the floor (20) along the major axis (16) adjacent to a major axis first sidewall (22); and wherein the first elevation (26) extends along the minor axis (18) by greater than or equal to 5% of a width of the floor (20) along the minor axis (18); a second elevation (34) formed from second elevation walls (36) protruding from the floor (20) in the Z direction and a second elevation bridge (43) extending between the second elevation walls (36), wherein the second elevation walls (36) extend along the major axis (16) from near a minor axis second sidewall (24) toward a transformer end of the base (32), wherein the second elevation (34) extends greater than or equal to 70% of a length of the floor (20) along the major axis (16) adjacent to a major axis second sidewall (22); and wherein the second elevation (34) extends along the minor axis (18) by greater than or equal to 5% of a width of the floor (20) along the minor axis (18); a first mounting column (40) located in the transformer end (32) of the plastic base (14) adjacent the major axis first sidewall (22); and a second mounting column (42) located in the transformer end (32) of the plastic base (14) adjacent the major axis second sidewall (22); wherein the first and second mounting columns (40, 42) have a top surface (44) that protrudes a distance from the floor (20), in the Z direction, in an amount greater than or equal to the elevation walls (28, 36), wherein the top surface (44) is configured to receive an attachment element (46).

In one embodiment, a method of altering voltage comprises: introducing voltage to a transformer; and altering the voltage of the transformer, wherein the transformer is disposed in a housing system, wherein the housing system comprises a plastic cover (12); a plastic base (14) having a major axis (16) and a minor axis (18), wherein the plastic base (14) comprises a floor (20) having sidewalls (22, 24) extending from the floor in a "Z" direction; a first elevation (26) formed from first elevation walls (28) protruding from the floor (20) in the Z direction and a first elevation bridge (41) extending between the first elevation walls (28), wherein the first elevation walls (28) extend along the major axis (18) from near a minor axis first sidewall (24) toward a transformer end of the base (32), wherein the first elevation (26) extends greater than or equal to 70% of a length of the floor (20) along the major axis (16) adjacent to a major axis first sidewall (22); and wherein the first elevation (26) extends along the minor axis (18) by greater than or equal to 5% of a width of the floor (20) along the minor axis (18); a second elevation (34) formed from second elevation walls (36) protruding from the floor (20) in the Z direction and a second elevation bridge (43) extending between the second elevation walls (36), wherein the second elevation walls (36) extend along the major axis (16) from near a minor axis second sidewall (24) toward a transformer end (32) of the plastic base (14), wherein the second elevation (34) extends greater than or equal to 70% of a length of the floor (20) along the major axis (16) adjacent to a major axis second sidewall (22); and wherein the second elevation (34) extends along the minor axis (18) by greater than or equal to 5% of a width of the floor (20) along the minor axis (18); a first mounting column (40) located in the transformer end (32) of the plastic base (14) adjacent the major axis first sidewall (22); and a second mounting column (42) located in the transformer end (32) of the plastic base (14) adjacent the major axis second sidewall (22); wherein the first and second mounting columns (40, 42) have a top surface (44) that protrudes a distance from the floor (20), in the Z direction, in an amount greater than or equal to the elevation walls (28, 36), wherein the top surface (44) is configured to receive an attachment element (46).

In the various embodiments: (i) the housing system further comprises perpendicular ribs (64) extending from the floor (20) and from the first elevation (26) to the second elevation (34) in a component end (60) of the plastic base (14); a transformer (72) having a weight of 5 to 10 kilograms physically attached to the mounting columns (40, 42); a capacitor (74) extending into a split cylinder (76); a fan (78); and a printed circuit board (80); and/or (ii) the housing system further comprises a center of gravity bracket (100) having connector lips (102) configured to attach to the top surface (44) of the mounting columns (40, 42); a platform (104) located between the connector lips (102) having a length and width to receive a transformer (72); a bracket wall (106) on opposite sides of the platform (104) extending from an edge of the platform (104) to the lip (102); wherein when the lips (102) are attached to the mounting columns (40, 42), the bracket walls (106) extend from the lips (102) toward the floor (20); and a transformer (72); wherein the housing system is configured to receive a transformer (72) having a weight of 7 kilograms and wherein the housing system remains intact with no visible damage after each surface of the housing system after a structural impact test comprising surrounding the assembled inverter housing system with expandable polystyrene packing material, enclosing the housing system and packing material in a six side, cardboard container having a wall thickness of less than or equal to 5 mm, and dropping the container from a height of 1.0 meter (m) onto a carpeted surface on each side of the container; and/or (iv) wherein the mounting columns (40, 42) have a bore (48) extending from the top surface (44) into the mounting columns (40, 42) dimensioned to receive the attachment element (46), wherein the mounting columns (40, 42) have structural ribs (50)

extending from the bore (48) to an edge of the mounting columns (40, 42); and/or (v) wherein the first elevation bridge (41) and the second elevation bridge (43) form a flat plateau having a constant distance in the Z direction from the floor (20); and/or (vi) wherein the housing system is configured to receive a transformer (72) having a weight of 7 kilograms and wherein the housing system remains intact with no visible damage after each surface of the housing system after a structural impact test comprising surrounding the assembled inverter housing system with expandable polystyrene packing material, enclosing the housing system and packing material in a six side, cardboard container having a wall thickness of less than or equal to 5 mm, and dropping the container from a height of 1.0 meters (m) onto a carpeted surface on each side of the container; and/or (vii) the housing system further comprises a split cylinder (76) having a connected end (82) attached to the floor (20) and an open end (84) opposite the connected end (82), wherein the connected end (82) has a diameter, $d_c$, and the open end (84) has a diameter, $d_o$, wherein $d_c$ is less than $d_o$, and wherein the split cylinder (76) has at least two slits (86) extending from the open end (84) to the connected end (82); and/or (viii) wherein the split cylinder (76) has greater than or equal to 3 slits (86); and/or (ix) wherein the split cylinder (76) changes from $d_o$ to $d_c$ with an annular ring (88) or wherein the split cylinder (76) changes from $d_c$ to $d_o$ at a ledge (92) that has an angle of 85° to 95° to a side (90) of the split cylinder (76); and/or (x) wherein the top surface (44) protrudes a distance from the floor (20), in the Z direction, in an amount less than the first elevation wall 28 and the second elevation wall 36; and/or (xi) the housing system further comprises a vapor plate (110) comprising a heat transfer wall (112) and a release wall (114), wherein the heat transfer wall (112) is configured to be located adjacent to a transformer (72), wherein the release wall (114) comprises heat exchange fins (116) across its surface; wherein between the heat transfer wall (112) and the release wall (114) is a fluid and capillary wick material such that in use, the material can absorb heat from the transformer (72) by changing to a vapor, migrate to the release wall (114) where it cools to a liquid, releasing heat, and is then wicked back to the heat transfer wall (112); and/or (xii) wherein the vapor plate (110) further comprises a thermally conductive paste (118) in contact with both the transformer (72) and the heat transfer wall (112); and/or (xiii) wherein the heat exchange fins (116) are oriented in a direction perpendicular to the airflow (120) through the housing system; and/or (xiv) wherein a minor axis sidewall (24) in the transformer end (32) comprises, a metal sheet (140) on an inner surface (142) of the minor axis sidewall (24) in an area that will be located adjacent the transformer (72) when in use, wherein the metal sheet (140) is corrugated, and a thermally insulating material (146) between the metal sheet (140) and the plastic of the minor axis first or second sidewall (24); and/or (xv) wherein the thermally insulating material (146) is corrugated complimentary to the metal sheet (140); and/or (xvi) wherein the metal sheet (140) has an outer surface (148) located opposite the thermally insulating material (146) that is polished; and/or (xvii) wherein the metal sheet (140) comprises aluminum and/or copper; and/or (xviii) wherein the housing system further comprises a first mounting bracket (210) and a second mounting bracket (212) attached to the floor (20) of the plastic base (14), near the minor axis sidewall (24) in the transformer end (32) of the plastic base (14), wherein the first and second mounting brackets (210, 212) comprise vertically extending walls (214) extending in a direction from the floor (20) having an attachment portion (228) extending toward the major axis sidewalls (22), and a connecting wall (216) disposed between the vertically extending walls (214); a transformer attachment (218) extending from the connecting wall (216); a plastic cover (12), wherein a cover extension member (222) extends from the plastic cover (12) and fits into an opening located in a compliant member (220) disposed between the cover extension member (222) and the transformer attachment (218); and/or (xix) the housing system further comprises a third mounting column (52) located in the transformer end (32) of the plastic base (14) adjacent the major axis first sidewall (22) and the minor axis first sidewall (24); a fourth mounting column (54) located in the transformer end (32) of the plastic base (14) adjacent the major axis second sidewall (22) and the minor axis first sidewall (24); a beam assembly (160) surrounding the transformer attachment (218), comprising: a plastic major axis beam (168) extending along the major axis sidewall (22) in the transformer end (32) of the plastic base (14); a plastic minor axis beam (162) extending along the minor axis sidewall (24) in the transformer end (32) of the plastic base (14); a support member (172) attached to the plastic base (14), wherein the minor axis beam (162) is supported by slots (170) on the major axis beam (168) and wherein the minor axis beam (162) is supported at an end by the support member (172); and a compliant member (174) disposed underneath the major axis beam (168) and the minor axis beam (162); and/or (xx) the housing system further comprises a mounting plate (230) attached to the first and second mounting columns (40,42), wherein the mounting plate (230) comprises openings (234) on a surface of the mounting plate (230) and a dissipater plate (232) attached to the mounting plate (230) on an end, wherein the dissipater plate (232) extends outward and protrudes upward from the mounting plate (230), wherein the dissipater plate (232) comprises a top portion (236) extending in the direction of the major axis (16), wherein the top portion (236) comprises openings (234) and heat dissipating fins (238) on a side of the top portion (236); and/or (xxi) the housing system further comprises a center of gravity (100) bracket having connector lips (102) configured to attach to the top surface (44) of the mounting columns (40, 42); a platform (104) located between the connector lips (102) having a length and width to receive a transformer (72); and a bracket wall (106) on opposite sides of the platform (104) extending from an edge of the platform (104) to the lip (102); wherein when the lips (102) are attached to the mounting columns (40, 42), the bracket walls (106) extend from the lips (102) toward the floor (20); and/or (xxii) wherein the first elevation (26) and/or the second elevation (34) has an elevation perpendicular rib (62) extending from the first elevation bridge (41) and the second elevation bridge (43), between the elevation walls (28, 36); and/or (xxiii) wherein the first elevation (26) and/or the second elevation (34) comprises an elevation parallel rib (68) extending from the elevation perpendicular rib (62) to another elevation perpendicular rib (62) or to a sidewall (22, 24); and/or (xxiv) the housing system further comprises perpendicular ribs (64) extending from the floor (20) and from the first elevation (26) to the second elevation (34) in the component end (60); and/or (xxv) the housing system further comprises parallel ribs (66) extending from perpendicular rib (64) to perpendicular rib (64) in the component end (60); and/or (xxvi) wherein the top surface (44) of the first mounting column (40) and the second mounting column (42) protrudes a distance from the floor (20), in the Z direction, in an amount less than the elevation walls (28, 36); and or (xxvii) wherein the top surface (44) of the third mounting column (52) and the fourth mounting column (54) comprise a height selected from the group consisting of: level with the top surface (44) of the first mounting column (40) and the second mounting column (42); greater than or equal to the top surface (44) of the first mounting column (40) and the second mounting column (42); less than or equal to the top surface (44) of the first mounting column (40) and the second mounting column (42); and combinations comprising at least one of the foregoing; and/or (xxviii) wherein the first elevation (26) extends along the minor axis (18) by 5% to 15% of a width of the floor (20) along the minor axis (18); and/or wherein the second elevation (34) extends along the minor axis (18) by 5% to 15% of a width of the floor (20) along the minor axis (18).

All ranges disclosed herein are inclusive of the endpoints, and the endpoints are independently combinable with each other (e.g., ranges of "up to 25 wt. %, or, more specifically, 5 wt. % to 20 wt. %", is inclusive of the endpoints and all intermediate values of the ranges of "5 wt. % to 25 wt. %," etc.). "Combination" is inclusive of blends, mixtures, alloys, reaction products, and the like. Furthermore, the terms "first," "second," and the like, herein do not denote any order, quantity, or importance, but rather are used to distinguish one element from another. The terms "a" and "an" and "the" herein do not denote a limitation of quantity, and are to be construed to cover both the singular and the plural, unless otherwise indicated herein or clearly contradicted by context. The suffix "(s)" as used herein is intended to include both the singular and the plural of the term that it modifies, thereby including one or more of that term (e.g., the film(s) includes one or more films). Reference throughout the specification to "one embodiment", "another embodiment", "an embodiment", and so forth, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments. All cited patents, patent applications, and other references are incorporated herein by reference in their entirety. However, if a term in the present application contradicts or conflicts with a term in the incorporated reference, the term from the present application takes precedence over the conflicting term from the incorporated reference. While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. A housing system, comprising:
a plastic cover (12);
a plastic base (14) having a major axis (16) and a minor axis (18), wherein the plastic base (14) comprises
  a floor (20) having sidewalls (22, 24) extending from the floor in a "Z" direction;
  a first elevation (26) formed from first elevation walls (28) protruding from the floor (20) in the Z direction and a first elevation bridge (41) extending between the first elevation walls (28), wherein the first elevation walls (28) extend along the major axis (18) from near a minor axis first sidewall (24) toward a transformer end (32) of the base, wherein the first elevation (26) extends greater than or equal to 70% of a length of the floor (20) along the major axis (16) adjacent to a major axis first sidewall (22); and wherein the first elevation (26) extends along the minor axis (18) by greater than or equal to 5% of a width of the floor (20) along the minor axis (18);
  a second elevation (34) formed from second elevation walls (36) protruding from the floor (20) in the Z direction and a second elevation bridge (43) extending between the second elevation walls (36), wherein the second elevation walls (36) extend along the major axis (16) from near a minor axis second sidewall (24) toward a transformer end (32) of the plastic base (14), wherein the second elevation (34) extends greater than or equal to 70% of a length of the floor (20) along the major axis (16) adjacent to a major axis second sidewall (22); and wherein the second elevation (34) extends along the minor axis (18) by greater than or equal to 5% of a width of the floor (20) along the minor axis (18);
  a first mounting column (40) located in the transformer end (32) of the plastic base (14) adjacent the major axis first sidewall (22); and
  a second mounting column (42) located in the transformer end (32) of the plastic base (14) adjacent the major axis second sidewall (22);
wherein the first and second mounting columns (40, 42) have a top surface (44) that protrudes a distance from the floor (20), in the Z direction, in an amount greater than or equal to the elevation walls (28, 36), wherein the top surface (44) is configured to receive an attachment element (46).

2. The housing system of claim 1, further comprising:
perpendicular ribs (64) extending from the floor (20) and from the first elevation (26) to the second elevation (34) in a component end (60) of the plastic base (14);
a transformer (72) having a weight of 5 to 10 kilograms physically attached to the mounting columns (40, 42);
a capacitor (74) extending into a split cylinder (76);
a fan (78); and
a printed circuit board (80).

3. The housing system of claim 1, further comprising:
a center of gravity bracket (100) having connector lips (102) configured to attach to the top surface (44) of the mounting columns (40, 42); a platform (104) located between the connector lips (102) having a length and width to receive a transformer (72); a bracket wall (106) on opposite sides of the platform (104) extending from an edge of the platform (104) to the lip (102); wherein when the lips (102) are attached to the mounting columns (40, 42), the bracket walls (106) extend from the lips (102) toward the floor (20); and
a transformer (72);
wherein the housing system is configured to receive a transformer (72) having a weight of 7 kilograms and wherein the housing system remains intact with no visible damage after each surface of the housing system after a structural impact test comprising surrounding the assembled inverter housing system with expandable polystyrene packing material, enclosing the housing system and packing material in a six side, cardboard container having a wall thickness of less than or equal to 5 mm, and dropping the container from a height of 1.0 meter (m) onto a carpeted surface on each side of the container.

4. The housing system of claim 1, wherein the mounting columns (40, 42) have a bore (48) extending from the top surface (44) into the mounting columns (40, 42) dimensioned to receive the attachment element (46), wherein the mounting columns (40, 42) have structural ribs (50) extending from the bore (48) to an edge of the mounting columns (40, 42).

5. The housing system of claim 1, wherein the first elevation bridge (41) and the second elevation bridge (43) form a flat plateau having a constant distance in the Z direction from the floor (20).

6. The housing system of any of claim 1, wherein the housing system is configured to receive a transformer (72) having a weight of 7 kilograms and wherein the housing system remains intact with no visible damage after each surface of the housing system after a structural impact test comprising surrounding the assembled inverter housing system with expandable polystyrene packing material, enclosing the housing system and packing material in a six side, cardboard container having a wall thickness of less than or equal to 5 mm, and dropping the container from a height of 1.0 meters (m) onto a carpeted surface on each side of the container.

7. The housing system of claim 1, further comprising a split cylinder (76) having a connected end (82) attached to the floor (20) and an open end (84) opposite the connected end (82), wherein the connected end (82) has a diameter, $d_c$, and the open end (84) has a diameter, $d_o$, wherein $d_c$ is less than $d_o$, and wherein the split cylinder (76) has at least two slits (86) extending from the open end (84) to the connected end (82).

8. The housing system of claim 1, wherein the split cylinder (76) has greater than or equal to 3 slits (86).

9. The housing system of any of claim 1, wherein the split cylinder (76) changes from $d_o$ to $d_c$ with an annular ring (88) or wherein the split cylinder (76) changes from $d_c$ to $d_o$ at a ledge (92) that has an angle of 85° to 95° to a side (90) of the split cylinder (76).

10. The housing system of claim 1, wherein the top surface (44) protrudes a distance from the floor (20), in the Z direction, in an amount less than the first elevation wall 28 and the second elevation wall 36.

11. The housing system of claim 1, further comprising a vapor plate (110) comprising a heat transfer wall (112) and a release wall (114), wherein the heat transfer wall (112) is configured to be located adjacent to a transformer (72), wherein the release wall (114) comprises heat exchange fins (116) across its surface; wherein between the heat transfer wall (112) and the release wall (114) is a fluid and capillary wick material such that in use, the material can absorb heat from the transformer (72) by changing to a vapor, migrate to the release wall (114) where it cools to a liquid, releasing heat, and is then wicked back to the heat transfer wall (112).

12. The housing system of claim 1, wherein the vapor plate (110) further comprises a thermally conductive paste (118) in contact with both the transformer (72) and the heat transfer wall (112).

13. The housing system of claim 1, wherein the heat exchange fins (116) are oriented in a direction perpendicular to the airflow (120) through the housing system.

14. The housing system of claim 1, wherein a minor axis sidewall (24) in the transformer end (32) comprises, a metal sheet (140) on an inner surface (142) of the minor axis sidewall (24) in an area that will be located adjacent the transformer (72) when in use, wherein the metal sheet (140) is corrugated, and a thermally insulating material (146) between the metal sheet (140) and the plastic of the minor axis first or second sidewall (24).

15. The housing system of claim 1, wherein the thermally insulating material (146) is corrugated complimentary to the metal sheet (140).

16. The housing system of claim 1, wherein the metal sheet (140) has an outer surface (148) located opposite the thermally insulating material (146) that is polished.

17. The housing system of claim 1, wherein the metal sheet (140) comprises aluminum and/or copper.

18. The housing system of claim 1, wherein the housing system further comprises a first mounting bracket (210) and a second mounting bracket (212) attached to the floor (20) of the plastic base (14), near the minor axis sidewall (24) in the transformer end (32) of the plastic base (14), wherein the first and second mounting brackets (210, 212) comprise vertically extending walls (214) extending in a direction from the floor (20) having an attachment portion (228) extending toward the major axis sidewalls (22), and a connecting wall (216) disposed between the vertically extending walls (214); a transformer attachment (218) extending from the connecting wall (216); and a plastic cover (12), wherein a cover extension member (222) extends from the plastic cover (12) and fits into an opening located in a compliant member (220) disposed between the cover extension member (222) and the transformer attachment (218).

19. The housing system of claim 1, further comprising:
a third mounting column (52) located in the transformer end (32) of the plastic base (14) adjacent the major axis first sidewall (22) and the minor axis first sidewall (24);
a fourth mounting column (54) located in the transformer end (32) of the plastic base (14) adjacent the major axis second sidewall (22) and the minor axis first sidewall (24);
a beam assembly (160) surrounding the transformer attachment (218), comprising:
a plastic major axis beam (168) extending along the major axis sidewall (22) in the transformer end (32) of the plastic base (14);
a plastic minor axis beam (162) extending along the minor axis sidewall (24) in the transformer end (32) of the plastic base (14);
a support member (172) attached to the plastic base (14), wherein the minor axis beam (162) is supported by slots (170) on the major axis beam (168) and wherein the minor axis beam (162) is supported at an end by the support member (172); and
a compliant member (174) disposed underneath the major axis beam (168) and the minor axis beam (162).

20. The housing system of claim 1, further comprising a mounting plate (230) attached to the first and second mounting columns (40, 42), wherein the mounting plate (230) comprises openings (234) on a surface of the mounting plate (230) and a dissipater plate (232) attached to the mounting plate (230) on an end, wherein the dissipater plate (232) extends outward and protrudes upward from the mounting plate (230), wherein the dissipater plate (232) comprises a top portion (236) extending in the direction of the major axis (16), wherein the top portion (236) comprises openings (234) and heat dissipating fins (238) on a side of the top portion (236).

21. The housing system of claim 1, further comprising a center of gravity (100) bracket having
connector lips (102) configured to attach to the top surface (44) of the mounting columns (40, 42);
a platform (104) located between the connector lips (102) having a length and width to receive a transformer (72); and
a bracket wall (106) on opposite sides of the platform (104) extending from an edge of the platform (104) to the lip (102);
wherein when the lips (102) are attached to the mounting columns (40, 42), the bracket walls (106) extend from the lips (102) toward the floor (20).

22. The housing system of claim 1, wherein the first elevation (26) and/or the second elevation (34) has an elevation perpendicular rib (62) extending from the first elevation bridge (41) and the second elevation bridge (43), between the elevation walls (28, 36).

23. The housing system of claim 1, wherein the first elevation (26) and/or the second elevation (34) comprises an elevation parallel rib (68) extending from the elevation perpendicular rib (62) to another elevation perpendicular rib (62) or to a sidewall (22, 24).

24. The housing system of claim 1, further comprising perpendicular ribs (64) extending from the floor (20) and from the first elevation (26) to the second elevation (34) in the component end (60).

25. The housing system of claim 1, further comprising parallel ribs (66) extending from perpendicular rib (64) to perpendicular rib (64) in the component end (60).

26. The housing system of claim 1, wherein the top surface (44) of the first mounting column (40) and the second mounting column (42) protrudes a distance from the floor (20), in the Z direction, in an amount less than the elevation walls (28, 36).

27. The housing system of claim 18, wherein the top surface (44) of the third mounting column (52) and the fourth mounting column (54) comprise a height selected from the group consisting of: level with the top surface (44) of the first mounting column (40) and the second mounting column (42); greater than or equal to the top surface (44) of the first mounting column (40) and the second mounting column (42); less than or equal to the top surface (44) of the first mounting column (40) and the second mounting column (42); and combinations comprising at least one of the foregoing.

28. The housing system of claim 1, wherein the first elevation (26) extends along the minor axis (18) by 5% to 15% of a width of the floor (20) along the minor axis (18); and/or wherein the second elevation (34) extends along the minor axis (18) by 5% to 15% of a width of the floor (20) along the minor axis (18).

29. A method of altering voltage, comprising:
introducing voltage to a transformer;
altering the voltage of the transformer, wherein the transformer is disposed in the housing system of claim 1.

* * * * *